(12) United States Patent
Ha et al.

(10) Patent No.: US 11,488,953 B2
(45) Date of Patent: Nov. 1, 2022

(54) SEMICONDUCTOR DEVICE HAVING GATE ISOLATION LAYER

(71) Applicant: SAMSUNG ELECTRONICS CO., LTD., Suwon-si (KR)

(72) Inventors: Seung Seok Ha, Suwon-si (KR); Hyun Seung Song, Suwon-si (KR); Hyo Jin Kim, Suwon-Si (KR); Kyoung Mi Park, Suwon-si (KR); Guk Il An, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 155 days.

(21) Appl. No.: 17/036,355

(22) Filed: Sep. 29, 2020

(65) Prior Publication Data
US 2021/0013200 A1    Jan. 14, 2021

Related U.S. Application Data

(63) Continuation of application No. 16/290,199, filed on Mar. 1, 2019, now Pat. No. 10,825,809.

(30) Foreign Application Priority Data

Aug. 8, 2018  (KR) .......................... 10-2018-0092505

(51) Int. Cl.
*H01L 21/00* (2006.01)
*H01L 27/088* (2006.01)
(Continued)

(52) U.S. Cl.
CPC ...... *H01L 27/0886* (2013.01); *H01L 21/3086* (2013.01); *H01L 21/823431* (2013.01); *H01L 21/823437* (2013.01); *H01L 21/823468* (2013.01); *H01L 21/823481* (2013.01); *H01L 29/6656* (2013.01); *H01L 29/66545* (2013.01); *H01L 29/66553* (2013.01); *H01L 29/66795* (2013.01); *H01L 29/7851* (2013.01)

(58) Field of Classification Search
CPC ............ H01L 27/0886; H01L 21/3086; H01L 21/823431
See application file for complete search history.

(56) References Cited

U.S. PATENT DOCUMENTS 8,609,510 B1 * 12/2013 Banna ............. H01L 21/823431
                                                 257/E21.409
9,755,034 B2 *  9/2017 Kim ................... H01L 29/0673
(Continued)

*Primary Examiner* — Laura M Menz
(74) *Attorney, Agent, or Firm* — Lee IP Law, P.C.

(57) ABSTRACT

A semiconductor device includes a substrate having a first region and a second region, first active fins that extend in a first direction in the first region, second active fins that extend in the first direction in the second region, a first field insulating layer between the first active fins and that extend in a second direction, a second field insulating layer between the second active fins and extending in the second direction, a gate line that extends in the second direction on the second field insulating layer, the gate line linearly along with the first field insulating layer, a gate isolation layer between the first field insulating layer and the gate line, and gate spacers that extend in the second direction, the gate spacers in contact with both sidewalls of each of the first field insulating layer, the gate line, and the gate isolation layer.

12 Claims, 33 Drawing Sheets

(51) Int. Cl.
*H01L 29/66* (2006.01)
*H01L 21/308* (2006.01)
*H01L 21/8234* (2006.01)
*H01L 29/78* (2006.01)

(56) References Cited

U.S. PATENT DOCUMENTS

| | | | |
|---|---|---|---|
| 9,755,079 B2* | 9/2017 | Park | H01L 27/1211 |
| 9,786,507 B2* | 10/2017 | Anderson | H01L 21/823878 |
| 9,887,210 B2* | 2/2018 | Song | H01L 27/0207 |
| 9,911,736 B1* | 3/2018 | Zang | H01L 29/66545 |
| 9,929,157 B1* | 3/2018 | Xie | H01L 29/66795 |
| 10,741,659 B2* | 8/2020 | Yoon | H01L 29/4238 |
| 10,825,809 B2* | 11/2020 | Ha | H01L 21/823878 |
| 11,201,150 B2* | 12/2021 | Baek | H01L 27/0207 |
| 2015/0214341 A1* | 7/2015 | Shin | H01L 27/0886 |
| | | | 438/425 |
| 2016/0071928 A1* | 3/2016 | Xie | H01L 29/0649 |
| | | | 257/401 |
| 2016/0268414 A1* | 9/2016 | Park | H01L 29/495 |
| 2017/0047243 A1* | 2/2017 | Shin | H01L 21/265 |
| 2017/0117375 A1* | 4/2017 | Kim | H01L 29/7869 |
| 2018/0006035 A1* | 1/2018 | Yuan | H01L 21/823878 |
| 2018/0033699 A1* | 2/2018 | Zhu | H01L 21/76232 |
| 2018/0083036 A1* | 3/2018 | Agarwal | H01L 27/0207 |
| 2019/0326407 A1* | 10/2019 | Yoon | H01L 29/42368 |
| 2019/0393315 A1* | 12/2019 | Noh | H01L 21/76834 |
| 2020/0051976 A1* | 2/2020 | Ha | H01L 21/823878 |
| 2021/0013200 A1* | 1/2021 | Ha | H01L 21/823468 |
| 2022/0069092 A1* | 3/2022 | Min | H01L 23/535 |

\* cited by examiner

SEMICONDUCTOR DEVICE HAVING GATE ISOLATION LAYER

CROSS-REFERENCE TO RELATED APPLICATIONS

This is a continuation application based on pending application Ser. No. 16/290,199, filed Mar. 1, 2019, the entire contents of which is hereby incorporated by reference.

Korean Patent Application No. 10-2018-0092505, filed on Aug. 8, 2018, in the Korean Intellectual Property Office, and entitled: "Semiconductor Device Having Gate Isolation Layer," is incorporated by reference herein in its entirety.

BACKGROUND

1. Field

Devices and methods consistent with example embodiments relate to a semiconductor device including a gate isolation layer and a method of manufacturing the same.

2. Description of Related Art

With an increase in the integration density of semiconductor devices, it is becoming increasingly difficult to realize transistor performance required by users. To overcome these technical difficulties, various field-effect transistor (FET) structures have been proposed. For example, a high-k dielectric-metal gate structure has been proposed to replace a conventional FET using silicon oxide and polycrystalline silicon as a gate insulating layer and a gate electrode material, respectively.

SUMMARY

According to example embodiments, there is provided a semiconductor device including a substrate having a first region and a second region, first active fins that extend in a first direction in the first region, second active fins that extend in the first direction in the second region, a first field insulating layer between the first active fins and configured to extend in a second direction, a second field insulating layer interposed between the second active fins and configured to extend in the second direction, a gate line configured to extend in the second direction on the second field insulating layer, the gate line disposed linearly along with the first field insulating layer, a gate isolation layer disposed between the first field insulating layer and the gate line, and gate spacers configured to extend in the second direction, the gate spacers in contact with both sidewalls of each of the first field insulating layer, the gate line, and the gate isolation layer.

According to example embodiments, there is provided a semiconductor device including active fins configured to extend in a first direction on a substrate, a pair of outer gate spacers that intersect the active fins and extend in a second direction, the pair of outer gate spacers apart from each other in the first direction, a pair of inner gate spacers that extend in the second direction between the pair of outer gate spacers, a first field insulating layer between the pair of outers gate pacers in plan view, a gate line spaced apart from the first field insulating layer in the first direction, the gate line between the pair of outer gate spacers and the pair of inner gate spacers, and a gate isolation layer between the pair of outer gate spacers and the pair of inner gate spacers, the gate isolation layer in contact with the first field insulating layer and the gate line.

According to example embodiments, there is provided a semiconductor device including a substrate including a first region and a second region, first active fins that extend in a first direction in the first region, second active fins that extend in the first direction in the second region, a diffusion break region in contact with short-axial sidewalls of the first active fins, a gate line spaced apart from the diffusion break region in a second direction, the gate line in contact with short-axial sidewalls of the second active fins, a gate isolation layer disposed between the diffusion break region and the gate line and disposed linearly along with the gate line in the second direction, and an inner gate spacer in contact with a first side surface of the diffusion break region, an inner side surface of the gate isolation layer, and an inner side surface of the gate line.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, a semiconductor device and a method of manufacturing the same according to embodiments will be described with reference to the accompanying drawings.

Figure 1A:
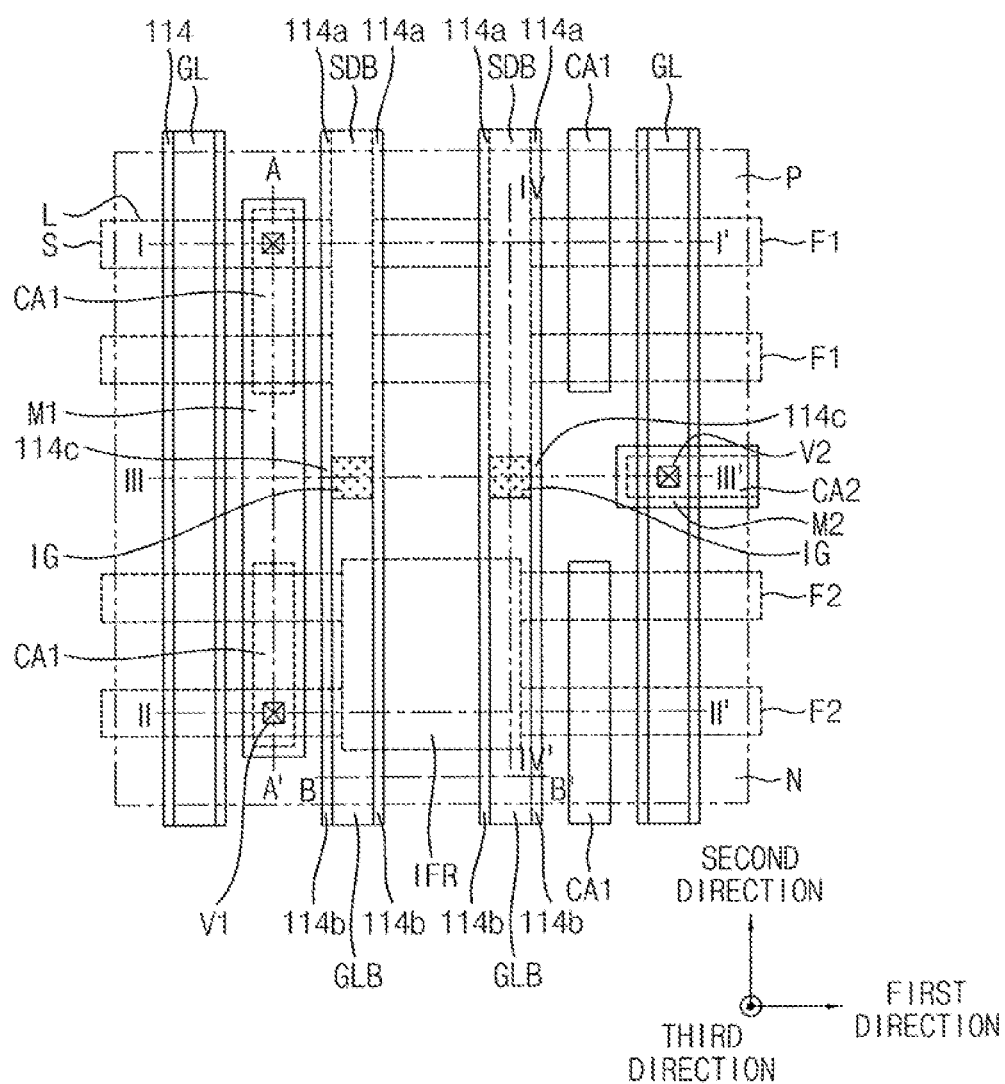
FIGS. 1A to 1F illustrate views of a semiconductor device according to an embodiment.
Figure 1B:
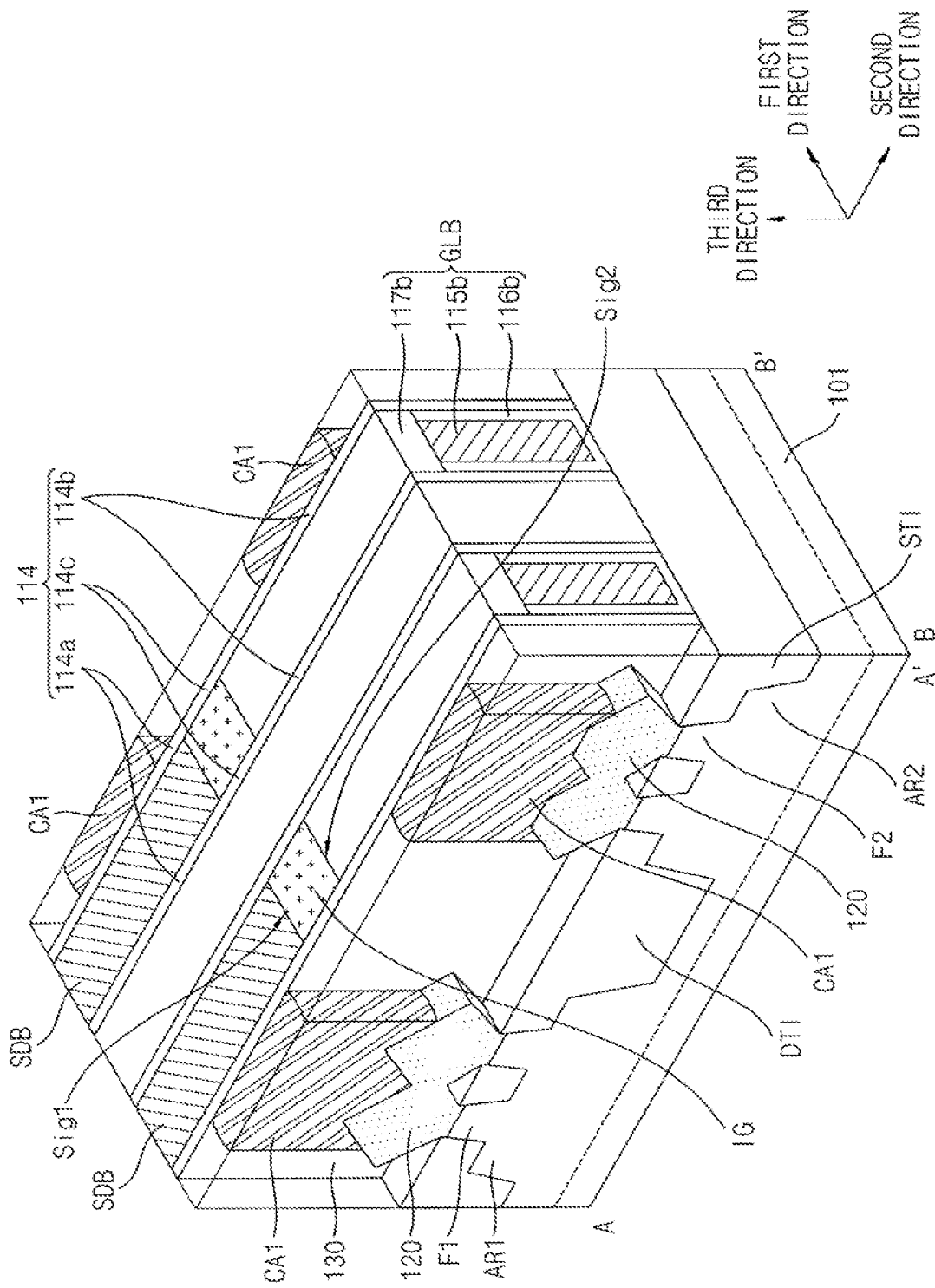
Figure 1C:
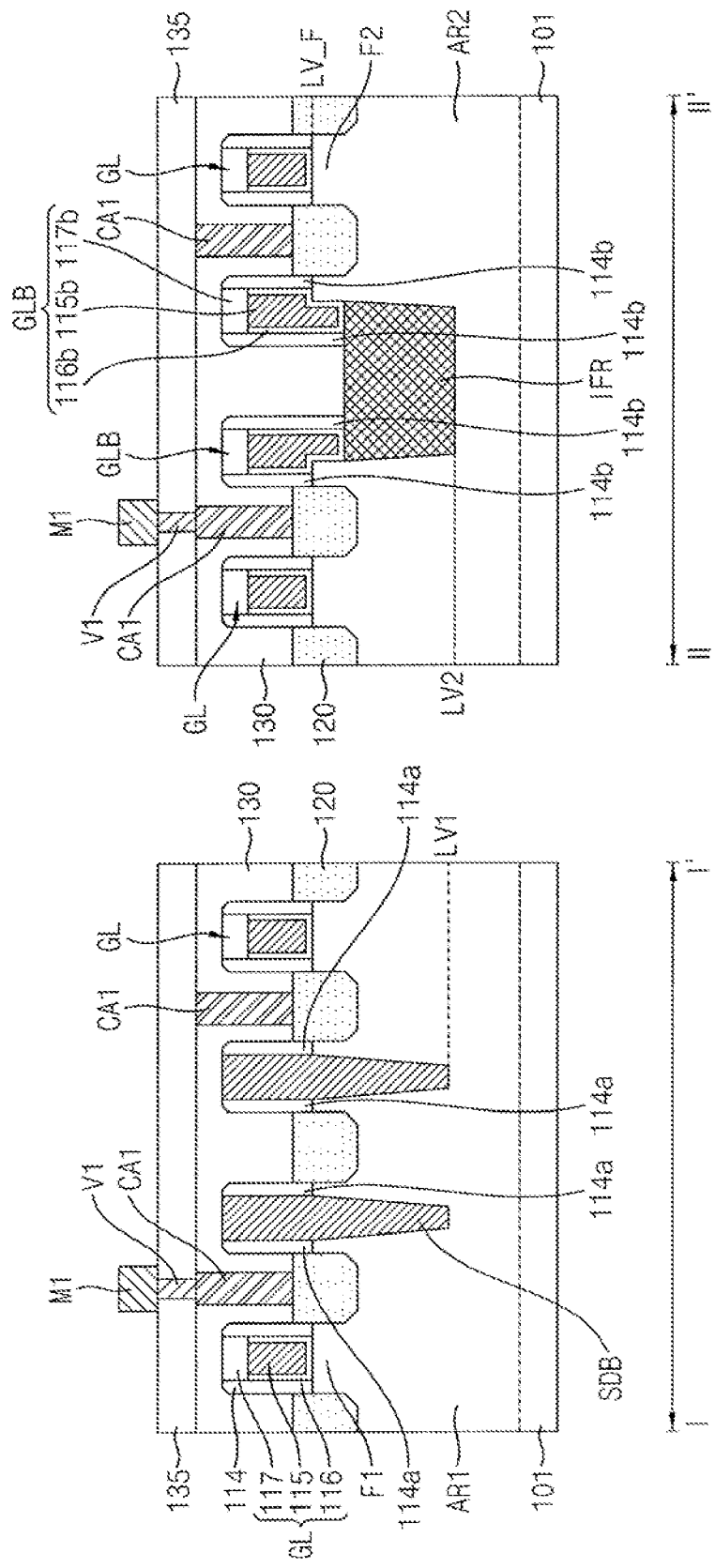
Figure 1D:
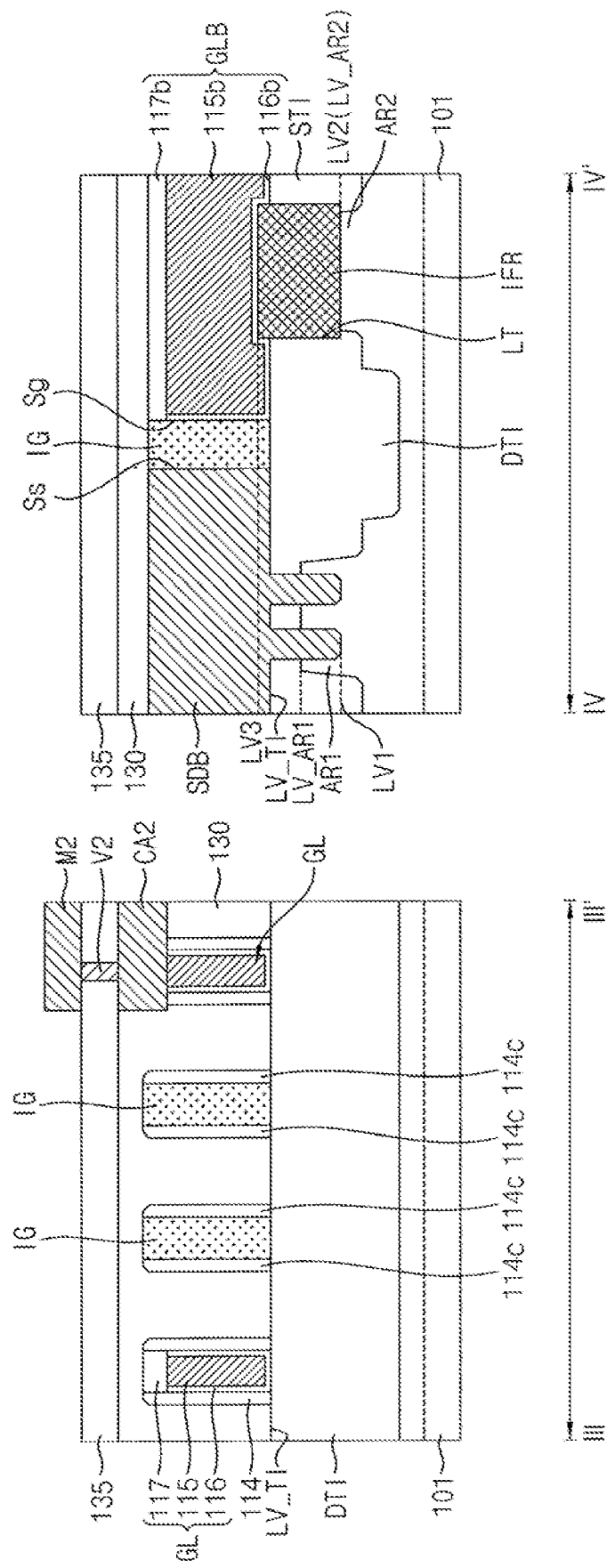

FIG. 1A schematically illustrates a layout of a partial region of a semiconductor device according to an embodiment. FIG. 1B shows a perspective view illustrating a vertical cross-section taken along lines A-A' and B-B' of FIG. 1A. FIG. 1C shows vertical cross-sectional views taken along lines I-I' and II-II' of FIG. 1A. FIG. 1D shows vertical cross-sectional views taken along lines III-III' and IV-IV' of FIG. 1A. For brevity, the illustration of active regions and an interlayer insulating layer is omitted in FIG. 1A, and the illustration of components at a level above a top end of a gate line is omitted in FIG. 1B.

Referring to FIGS. 1A to 1D, a semiconductor device 100*a* may include a substrate 101, active regions AR1 and AR2, active fins F1 and F2, device isolation layers STI and DTI, a first field insulating layer SDB, a second field insulating layer IFR, gate lines GL and GLB, a gate isolation layer IG, gate spacers 114, source and drain regions 120, and interlayer insulating layers 130 and 135.

The substrate 101 may include a first region P and a second region N. For example, the first region P may be a P-type metal-oxide-semiconductor (PMOS) region, and the second region N may be an N-type MOS (NMOS) region. The substrate 101 may include a semiconductor material, such as silicon and germanium. For example, the substrate 101 may be formed of at least one material selected out of silicon (Si), germanium (Ge), silicon germanium (SiGe), gallium phosphide (GaP), gallium arsenide (GaAs), silicon carbide (SiC), silicon germanium carbide (SiGeC), indium arsenide (InAs), and indium phosphide (InP). However, the substrate 101 may be a silicon on insulator (SOI) substrate.

The active regions AR1 and AR2 may include a first active region AR1 and a second active region AR2. The first active region AR1 may be in the first region P, and the second active region AR2 may be in the second region N. The active regions AR1 and AR2 may extend in a first direction. The active regions AR1 and AR2 may be spaced to be apart from each other in a second direction intersecting the first direction. The active regions AR1 and AR2 may protrude in a third direction, intersecting the first and second directions, which is vertical to, e.g. orthogonal to, a surface of the substrate 101. Top ends of the first active region AR1 and the second active region AR2 may be at a relatively high level LV_AR1. In an embodiment, a top end of a portion of the second active region AR2 may be at a relatively low level LV_AR2.

The active fins F1 and F2 may include a first active fin F1 in the first region P and a second active fin F2 in the second region N. The first active fin F1 may be on the first active region AR1, and the second active fin F2 may be on the second active region AR2. The active fins F1 and F2 may extend in the first direction. Each of the active fins F1 and F2 may include long-axial sidewalls L, which extend in a first direction, and short-axial sidewalls S, which extend in the second direction. The long-axial sidewalls L are longer than the short-axial sidewalls S. The active fins F1 and F2 may be spaced to be apart from each other in the first direction so that the short-axial sidewalls S of the active fins F1 and F2 may face each other. The active fins F1 and F2 may be spaced apart from each other in the second direction so that the long-axial sidewalls L of the active fins F1 and F2 may face each other. The active fins F1 and F2 may protrude in the third direction from the active region AR1 and AR2. Although two active fins F1 and F2 are illustrated as being on one of the active regions AR1 and AR2, one or at least three active fins may be on one of the active regions AR1 and AR2.

The active regions AR1 and AR2 and the active fins F1 and F2 may be portions of the substrate 101, and may include epitaxial layers grown from the substrate 101. In an embodiment, the active regions AR1 and AR2 and the active fins F1 and F2 may include a semiconductor material. For example, the active regions AR1 and AR2 and the active fins F1 and F2 may include silicon (Si), silicon germanium (SiGe), or the like. The active regions AR1 and AR2 and the active fins F1 and F2 may include the same material as the substrate 101. For example, when the substrate 101 includes Si, the active regions AR1 and AR2 and the active fins F1 and F2 may also include Si. However, the substrate 101 may include a different material from the active regions AR1 and AR2 and the active fins F1 and F2.

The device isolation layers STI and DTI may include a shallow device isolation layer STI and a deep device isolation layer DTI. The device isolation layers STI and DTI may define the active regions AR1 and AR2 and the active fins F1 and F2. For example, the device isolation layers STI and DTI may cover sidewalls of the active regions AR1 and AR2 on the substrate 101. The device isolation layers STI and DTI may cover lower sidewalls of the active fins F1 and F2, but may not cover upper portions thereof. In an embodiment, the shallow device isolation layer STI may be in the first region P and the second region N, and the deep device isolation layer DTI may be in the first region P and the second region N. A bottom surface of the deep device isolation layer DTI may be at a lower level, e.g., closer to the substrate 101 along the third direction, than a bottom surface of the shallow device isolation layer STI. The device isolation layers STI and DTI may include any one of oxide, oxynitride, nitride, or the like.

The first field insulating layer SDB may be in contact with the short-axial sidewalls S of the first active fins F1 in the first region P and extend in the second direction. The first field insulating layer SDB may be on the device isolation layers STI and DTI, and a partial region of the first field insulating layer SDB may extend downward, e.g., along the third direction towards the substrate 101, and be between the first active fins F1. A partial region of the first field insulating layer SDB may be between the first active regions AR1. That is, the partial region of the first field insulating layer SDB may extend downward, e.g., along the third direction towards the substrate 101, so that a level LV1 of a bottom end of the extended portion of the first field insulating layer SDB may be lower than a level LV_F of top ends of the active fins F1 and F2 and higher than a level LV_AR1 of a top end of the first active region AR1. Alternatively, the partial region of the first field insulating layer SDB may extend further downward, e.g., along the third direction towards the substrate 101, so that the level LV1 of the bottom end of the extended portion of the first field insulating layer SDB is lower than the level LV_AR1 of the top end of the first active region AR1. A level of a top surface of the first field insulating layer SDB may be higher, further from the substrate 101 along the third direction, than the level LV_F of the top ends of the active fins F1 and F2 and higher than a level of top ends of the source and drain regions 120.

In an embodiment, two first field insulating layers SDB may be adjacent to each other in the first direction, e.g., no other components that extend along the second direction are therebetween, and may be parallel to each other and extend in the second direction. One source or drain region 120 may be between the two first field insulating layers SDB.

In an embodiment, the first field insulating layer SDB may include a compressive stress material and/or a tensile stress material. For example, the compressive stress material may be a material capable of applying compressive stress to an active region, and the tensile stress material may be a material capable of applying tensile stress to the active region. For instance, the first field insulating layer SDB may include silicon nitride.

The second field insulating layer IFR may be in contact with the short-axial sidewalls S of the second active fins F2 in the second region N and extend in the second direction. The second field insulating layer IFR may be in contact with the device isolation layers STI and DTI. A bottom surface of the second field insulating layer IFR may be in contact with a portion of the second active region AR2 which has a top end having a relatively low level LV_AR2, e.g., closer to the substrate 101 along the third direction than that of the first active region AR1. A width of the second field insulating layer IFR in the first direction may be greater than a width of the first field insulating layer SDB. In an embodiment, a level LV2 of the bottom surface of the second field insulating layer IFR may be different from the level LV1 of the bottom end of the first field insulating layer SDB. A level LV3 of a top surface of the second field insulating layer IFR may be lower than the level LV_F of the top ends of the active fins F1 and F2 and higher than top surfaces of the device isolation layers STI and DTI. However, the level LV3 of the top surface of the second field insulating layer IFR may be higher than the level LV_F of the top ends of the active fins F1 and F2 or may be lower than or equal to the level of the top surfaces of the device isolation layers STI and DTI.

In an embodiment, the second field insulating layer IFR may be formed of the same material as the device isolation layers STI and DTI. Although a boundary between the second field insulating layer IFR and the device isolation layers STI and DTI is clearly illustrated, the second field insulating layer IFR may be integrally formed with the device isolation layers STI and DTI. That is, the second field insulating layer IFR may be a portion of the device isolation layers STI and DTI. In an embodiment, the second field insulating layer IFR may include a tensile stress material and/or a compressive stress material. For example, the second field insulating layer IFR may include an oxide, e.g., tetraethyl orthosilicate (TEOS).

The gate lines GL may intersect the active fins F1 and F2 on the device isolation layers STI and DTI, and extend in the second direction. The gate lines GL may be spaced apart from the first field insulating layer SDB in the first direction and parallel to the first field insulating layer SDB. The gate lines GLB may be spaced apart from the first field insulating layer SDB in the second direction and spaced apart from the gate lines GL in the first direction. A width of the gate lines GL and GLB in the first direction may be substantially equal to a width of a top end of the first field insulating layer SDB in the first direction.

Any two (e.g., GLB) of the gate lines GL and GLB may be in contact with the top surface of the second field insulating layer IFR and intersect the second field insulating layer IFR. For example, as shown in FIGS. 1A, 1C, and 1D, a first gate line GLB may cover a first end portion of the second active fin F2 and a portion of the top surface of the second field insulating layer IFR, while a second gate line GLB may cover a second end portion of the second active fin F2, opposite the first end portion across the second field insulating layer IFR, and another portion of the top surface of the second field insulating layer IFR. Thus, from among the first field insulating layer SDB and the second field insulating layer IFR, a field insulating layer having a width corresponding to the gate lines GL and GLB may be called a "single diffusion break region." Further, from among the first field insulating layer SDB and the second field insulating layer IFR, a field insulating layer having a width in the first direction greater than a shortest distance between the gate lines GL and GLB in the first direction may be called a "double diffusion break region." That is, the first field insulating layer SDB shown in FIG. 1C may be a single diffusion break region, and the second field insulating layer IFR may be a double diffusion break region.

The gate lines GL and GLB may include gate electrodes 115 and 115b, gate insulating layers 116 and 116b, and gate capping layers 117 and 117b, respectively. Each of the gate electrodes 115 and 115b may include at least two stacked layers. In an embodiment, each of the gate electrodes 115 and 115b may include a first gate metal layer and a second gate metal layer. The first gate metal layer may control a work function and the second gate metal layer may fill a space in the first gate metal layer. The first gate metal layer may include, e.g., at least one of titanium nitride (TiN), tungsten nitride (WN), titanium aluminide (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), a combination thereof, or the like. In addition, the second gate metal layer may include, e.g., at least one of tungsten (W), aluminum (Al), cobalt (Co), titanium (Ti), tantalum (Ta), polysilicon (poly-Si), silicon germanium (SiGe), a metal alloy, or the like.

The gate insulating layers 116 and 116b may be between the gate electrodes 115 and 115b and the active fins F1 and F2, respectively. Further, the gate insulating layers 116 and 116b may be between the gate electrodes 115 and 115b and the device isolation layers DTI and STI, respectively. In an embodiment, the gate insulating layer 116 may extend in the second direction along profiles of the active fins F1 and F2 protruding from the device isolation layers DTI and STI. The gate insulating layers 116 and 116b may extend in the third direction along a side surface of the gate electrode 115. The gate insulating layers 116 and 116b may include a high-k dielectric material having a higher dielectric constant than silicon oxide. For example, the gate insulating layers 116 and 116b may include hafnium oxide ($HfO_2$), zirconium oxide ($ZrO_2$), lanthanum oxide (LaO), aluminum oxide ($Al_2O_3$), tantalum oxide ($Ta_2O_5$), or the like. For example, the gate electrodes 115 and 115b and the gate insulating layers 116 and 116b may be formed using a replacement process (or a gate last process).

The gate capping layers 117 and 117b may be on the gate electrodes 115 and 115b and the gate insulating layers 116 and 116b. For example, the gate capping layers 117 and 117b may include at least one of a silicon nitride film and a silicon oxynitride film.

In an embodiment, the gate line GLB and the first field insulating layer SDB may be form a line in the second direction, e.g., the first field insulating layer SDB may be in the first region P and the gate line GLB may be in the second region N. The gate line GLB may be spaced to be apart from the first field insulating layer SDB in the second direction, e.g., by a gate isolation layer IG. A short-axial sidewall Sg of the gate line GLB, which extends in the first direction, may face a short-axial sidewall Ss of the first field insulating layer SDB. The gate line GLB may overlap a portion of the second field insulating layer IFR from viewed from above, e.g., in plan view and along the third direction.

In an embodiment, the gate electrode 115b and the first field insulating layer SDB may form a line in the second direction, e.g., may overlap along the second direction. The gate electrode 115b may be spaced to be apart from the first field insulating layer SDB in the second direction. A first side surface (i.e., a short-axial sidewall), which extends in the first direction, of the gate electrode 115b may face the short-axial sidewall Ss of the first field insulating layer SDB.

The gate insulating layer 116b may cover a bottom surface of the gate electrode 115b, a short-axial side surface of the gate electrode 115b which extends in the first direction, and a long-axial side surface of the gate electrode 115b which extends in the second direction. The gate insulating layer 116b may be between the second field insulating layer IFR and the gate electrode 115b, between the second active fins F2 and the gate electrode 115b, and between the device isolation layers STI and DTI and the gate electrode 115b. That is, the gate insulating layer 116 may extend in the second direction along profiles of the device isolation layers STI and DTI, the second field insulating layer IFR, and the second active fins F2. The gate insulating layer 116b may extend in the third direction along side surfaces of the gate electrode 115b. In other words, the gate insulating layer 116b may separate the gate electrode 115b from other components immediately adjacent thereto.

The gate isolation layer IG may be on the device isolation layers STI and DTI between the first field insulating layer SDB and the gate line GLB. A first side surface Sig1 of the gate isolation layer IG may be in contact with the short-axial sidewall Ss of the first field insulating layer SDB. A second side surface Sig2 of the gate isolation layer IG may be in contact with the short-axial sidewall Sg of the gate line GLB. That is, the second side surface Sig2 of the gate isolation layer IG may be in contact, e.g., direct contact, with the gate insulating layer 116b and the gate capping layer 117b. The gate isolation layer IG may be in contact with a portion of the gate insulating layer 116b, that extends in the third direction between the gate electrode 115b and the gate isolation layer IG. In an embodiment, the gate isolation layer IG may be formed of a single insulating material or a plurality of insulating materials. For instance, the gate isolation layer IG may be formed of silicon oxide, silicon nitride, air spaces, a combination thereof, or the like.

The gate spacers 114 and 114b may be on both sidewalls of the gate lines GL and GLB, respectively. That is, the gate spacers 114 and 114b may extend in the second direction and be in contact with both side surfaces, e.g., sides surfaces spaced apart along the first direction, of the gate insulating layers 116 and 116b, and of the gate capping layer 117 and 117b, respectively. Further, the gate spacers 114 may extend in the second direction and may also be on both sidewalls of the gate isolation layer IG and both sidewalls of the first field insulating layer SDB.

In an embodiment, the gate spacers 114 may include first gate spacers 114a, second gate spacers 114b, and third gate spacers 114c. The first gate spacers 114a may be on both sidewalls of the first field insulating layer SDB. The second gate spacers 114b may be on both sidewalls of the gate line GLB, which may overlap the first field insulating layer SDB along the second direction. The third gate spacers 114c may be on both sidewalls of the gate isolation layer IG between the first gate spacers 114a and the second gate spacers 114b in the second direction. The first gate spacers 114a may be connected to the third gate spacers 114c, and the second gate spacers 114b may be connected to the third gate spacers 114c so that the first to third gate spacers 114a, 114b, and 114c may integrally form the gate spacers 114. In an embodiment, the gate spacers 114 may include nitride. A level of top ends of the gate spacers 114 may be equal to a level of top surfaces of the gate capping layers 117 and 117b and a level of the top surface of the first field insulating layer SDB. For example, the gate spacers 114 may include at least one of silicon nitride, silicon oxynitride, silicon oxide, silicon oxycarbonitride, a combination thereof, or the like.

The source and drain regions 120 may be on both sides of the gate spacers 114 and the gate lines GL and GLB. The source and drain regions 120 may be in the active fins F1 and F2. That is, the source and drain regions 120 may be formed in partially etched regions of the active fins F1 and F2. Although the source and drain regions 120 are illustrated as being in contact with each other in the second direction in FIG. 1B, the source and drain regions 120 may be spaced to be apart from each other along the second direction. In an embodiment, the source and drain regions 120 may be elevated source and drain regions. Thus, the top ends of the source and drain regions 120 may be at a higher level than the top ends of the active fins F1 and F2.

In an embodiment, the source and drain regions 120 in the first region P may include a compressive stress material. For example, the compressive stress material may be a material (e.g., SiGe) having a higher lattice constant than silicon. The compressive stress material may apply compressive stress to the active fins F1 and F2 (i.e., channel regions) under the gate lines GL and GLB and improve the mobility of carriers in the channel regions. Meanwhile, the source and drain regions 120 in the second region N may include the same material as the substrate 101 or a tensile stress material. For instance, when the substrate 101 includes silicon, the source and drain regions 120 may include silicon or a material (e.g., silicon carbide (SiC) and silicon phosphide (SiP)) having a lower lattice constant than silicon. The tensile stress material may apply tensile stress to the active fins F1 and F2 (i.e., the channel regions) under the gate lines GL and GLB and improve the mobility of carriers in the channel regions.

In an embodiment, the source and drain regions 120 may be formed using an epitaxial growth process. A silicide layer may be formed on the source and drain regions 120. The silicide layer may be formed along top surfaces of the source and drain regions 120. The silicide layer may serve to reduce a sheet resistance, a contact resistance, or the like when the source and drain regions 120 are in contact with a first contact CA1. The silicide layer may include a conductive material, for example, platinum (Pt), nickel (Ni), cobalt (Co), or the like. The silicide layer may be a layer formed by siliciding the source and drain regions 120 that are in contact with the first contact CA1.

A first interlayer insulating layer 130 may cover the source and drain regions 120, the gate lines GL and GLB, the gate spacers 114, the first field insulating layer SDB, and the device isolation layers STI and DTI. A second interlayer insulating layer 135 may cover the first interlayer insulating layer 130. The first interlayer insulating layer 130 and the second interlayer insulating layer 135 may include, e.g., at least one of silicon oxide, silicon nitride, silicon oxynitride, a low-k dielectric material, or the like.

The first contact CA1 may pass through, e.g., extend along the third direction, the first interlayer insulating layer 130 to contact the source or drain region 120. The first contact CA1 may electrically connect the source or drain region 120 with a first interconnection M1. For example, the first contact CA1 may have an elongated shape, e.g., that extends along the second direction, when viewed from above, e.g., in plan view. The first contact CA1 may include a conductive material. The first contact CA1 may include, for example, tungsten (W), aluminum (Al), copper (Cu), or the like. The first contact CA1 may include a barrier layer and a conductive layer.

A first via V1 may extend along the third direction through the second interlayer insulating layer 135 to contact the first contact CA1. The first via V1 may electrically connect the first contact CA1 with the first interconnection M1. The first interconnection M1 may be on the second interlayer insulating layer 135. The first interconnection M1 may be electrically connected to the first via V1.

A second contact CA2 may be on the gate line GL. The second contact CA2 may extend along the third direction through the first interlayer insulating layer 130 and the gate capping layer 117 to be in contact with the gate electrode 115. The second contact may extend along the first direction. The second via V2 may extend along the third direction through the second interlayer insulating layer 135 to contact the second contact CA2. The second via V2 may electrically connect the second contact CA2 with the second interconnection M2. The second interconnection M2 may be on the second interlayer insulating layer 135. The second interconnection M2 may be electrically connected to the second via V2.

Figure 1E:
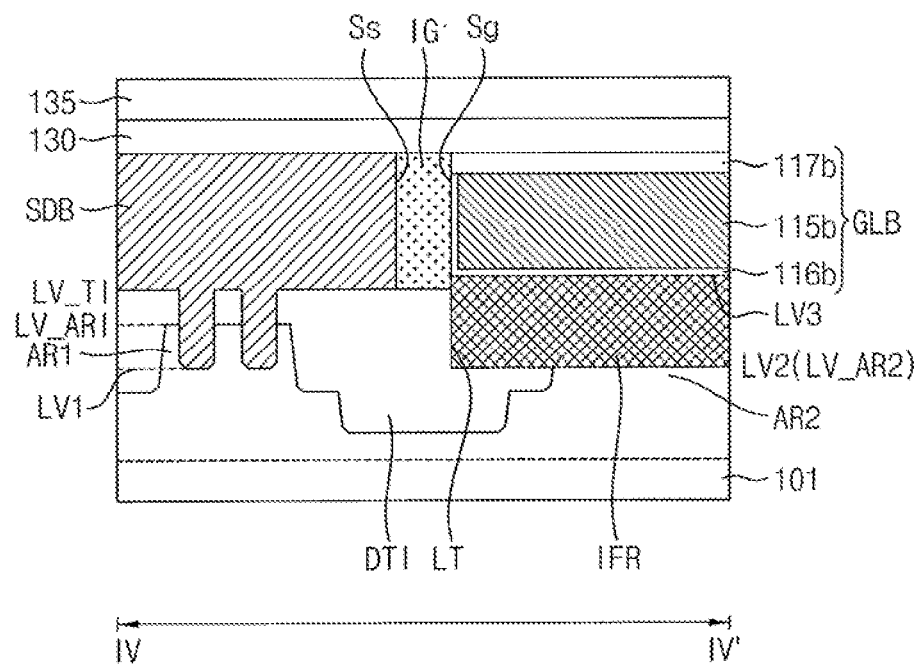
Figure 1F:
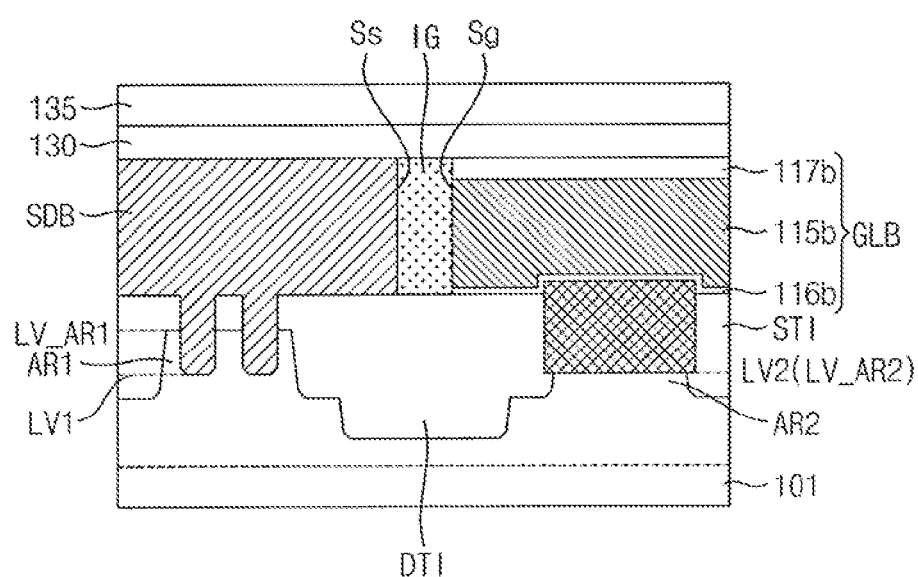

FIGS. 1E and 1F show vertical cross-sectional views taken along a line IV-IV' of FIG. 1A, according to embodiments. Hereinafter, the same descriptions as in FIGS. 1A to 1D will be omitted for brevity.

Referring to FIG. 1E, the second field insulating layer IFR may extend along a second direction and be in contact with the gate isolation layer IG, e.g., may have an upper portion of a sidewall of the second field insulating layer IFR in contact with a lower portion of the gate isolation layer IG. Although a portion of one side surface of the gate isolation layer IG is illustrated as being in contact with a portion of another side surface of the second field insulating layer IFR, the second field insulating layer IFR may further extend in the second direction so that a bottom surface of the gate isolation layer IG may be in contact with an upper surface of the second field insulating layer IFR. A level LV3 of a bottom surface of a gate line GLB may be higher than a level of the bottom surface of the gate isolation layer IG and higher than a level LV_TI of top surfaces of device isolation layers STI and DTI.

Referring to FIG. 1F, each of a gate electrode 115*b* and a gate capping layer 117*b* may be in contact with the gate isolation layer IG. That is, unlike that which is shown in FIGS. 1D and 1E, the gate insulting layer 116*b* may be only under the gate line GLB and may not extend in a third direction between the gate isolation layer IG and the gate electrode 115*b*.

Figure 2A:
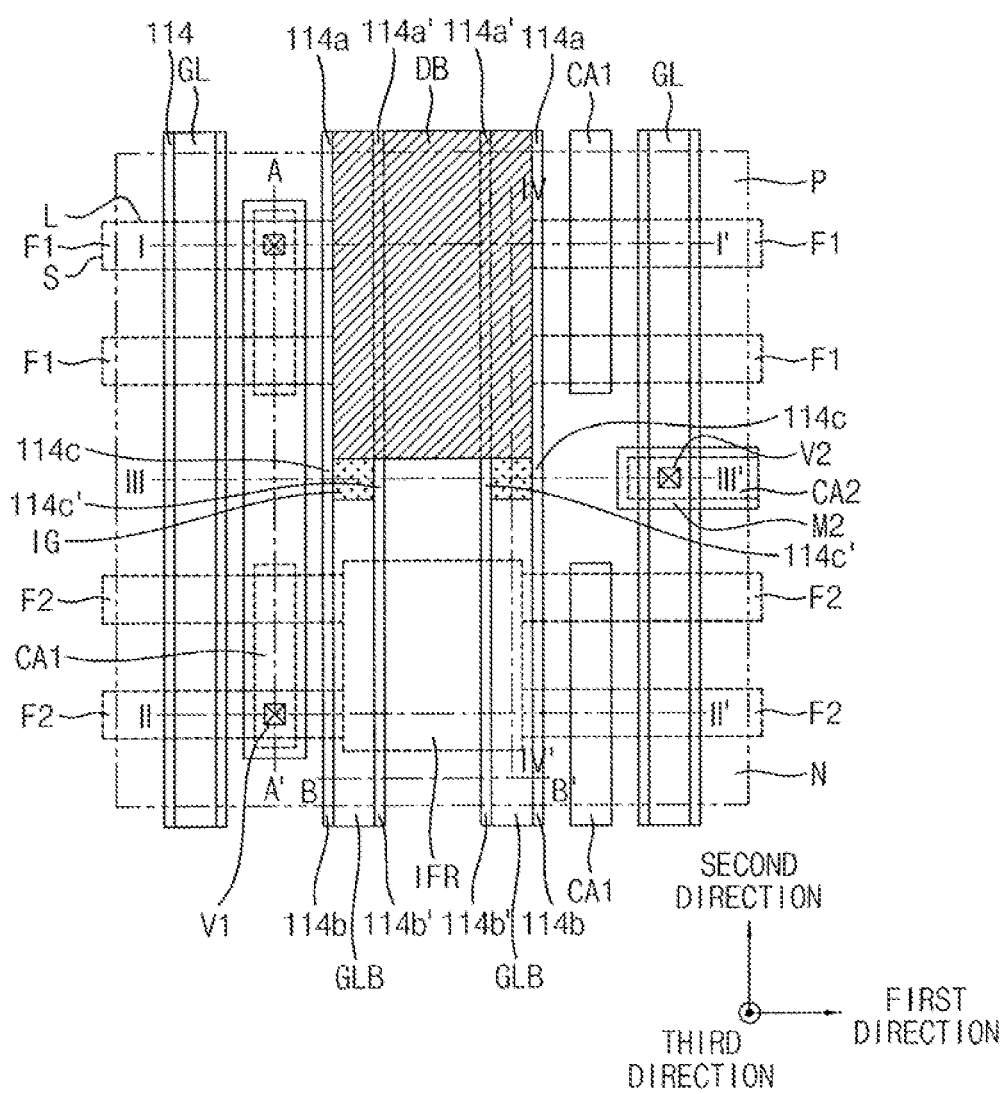
FIGS. 2A to 2E illustrate views of a semiconductor device according to an embodiment.
Figure 2B:
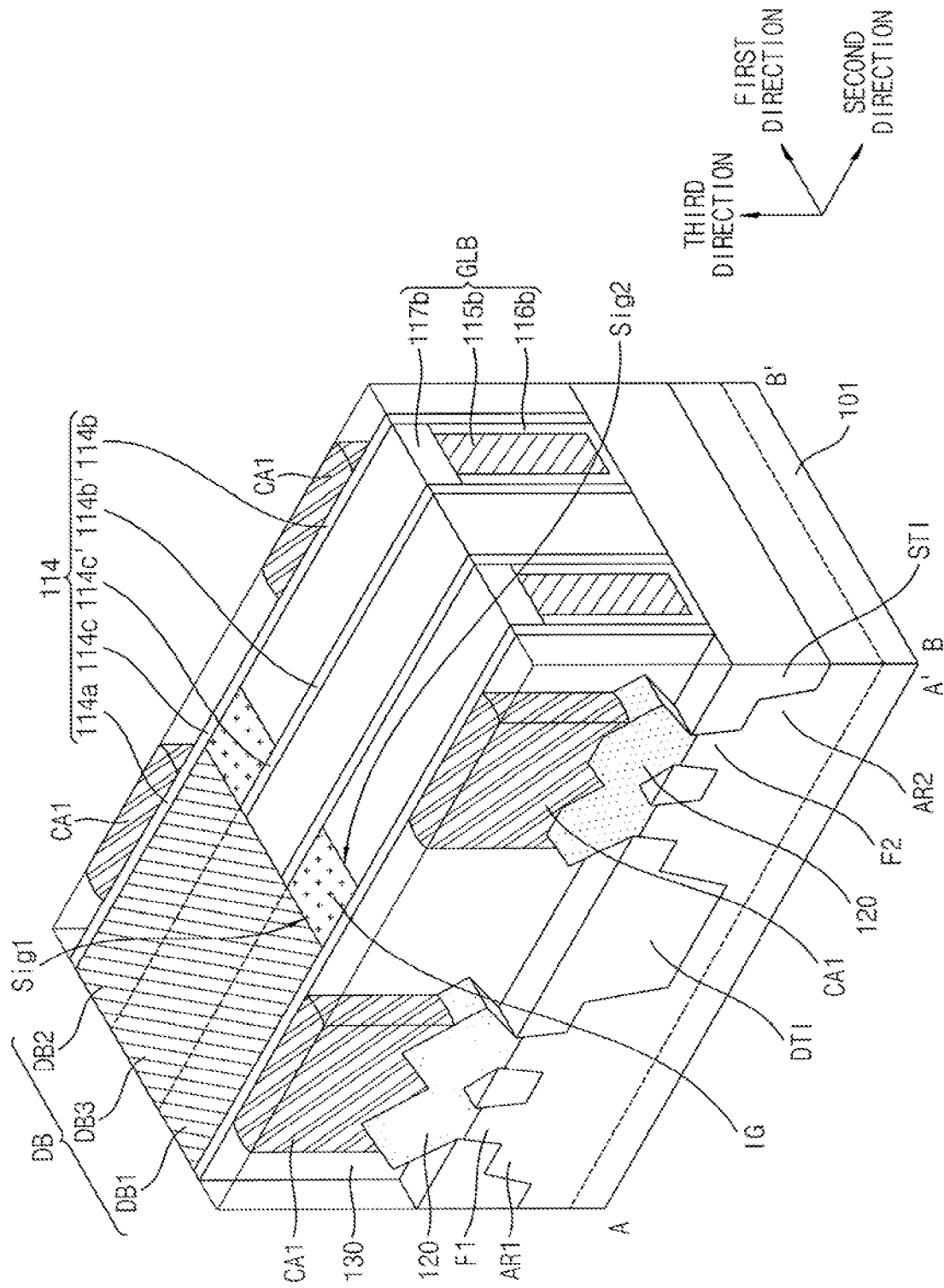
Figure 2C:
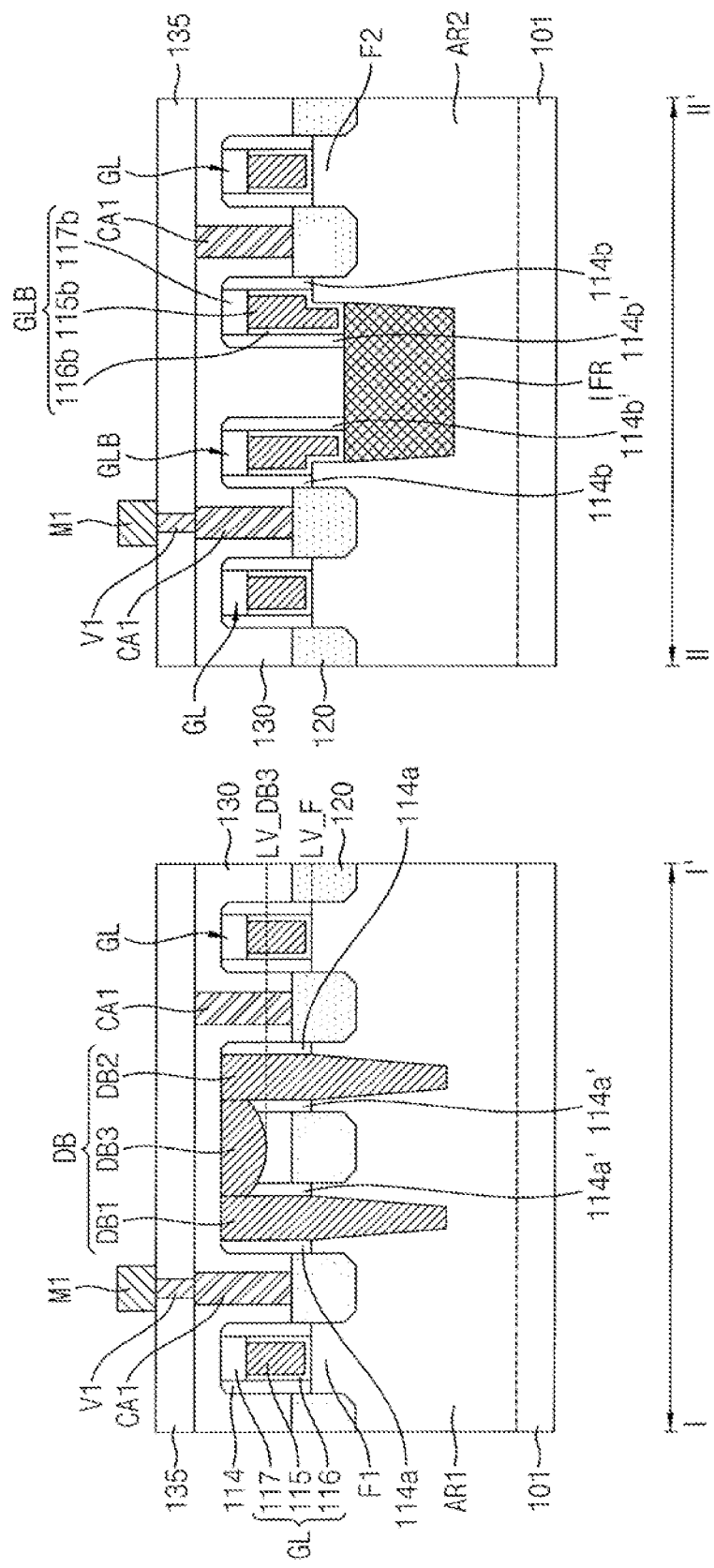
Figure 2D:
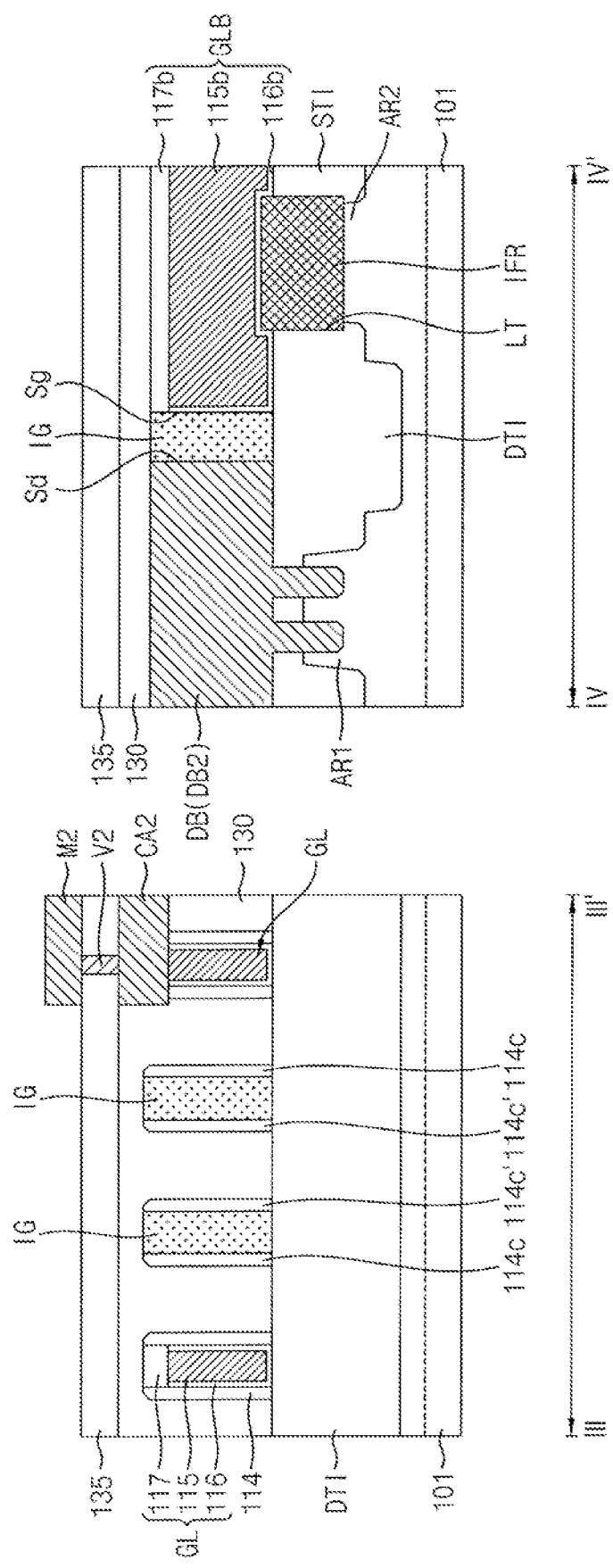
Figure 2E:
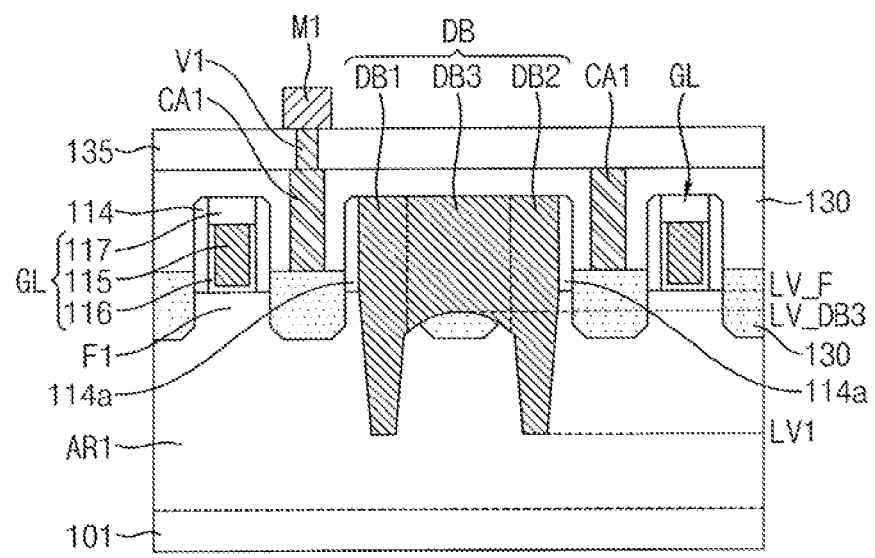

FIG. 2A illustrates a layout of a partial region of a semiconductor device according to an embodiment. FIG. 2B is a perspective view illustrating a vertical cross-section taken along lines A-A' and B-B' of FIG. 2A. FIG. 2C shows vertical cross-sectional views taken along lines I-I' and II-II' of FIG. 2A. FIG. 2D shows vertical cross-sectional views taken along lines and III-III' of FIG. 2A. FIG. 2E shows a vertical cross-sectional view taken along lines I-I' of FIG. 2A, according to an embodiment. Hereinafter, the same descriptions as in FIGS. 1 to 1F will be omitted for brevity.

Referring to FIGS. 2A to 2D, the semiconductor device 100*b* may include a first field insulating layer DB, pairs of outer gate spacers 114*a*, 114*b*, and 114*c*, and pairs of inner gate spacers 114*a'*, 114*b'*, and 114*c'*.

The first field insulating layer DB may be in contact with short-axial sidewalls S of fin active fins F1 in a first region P and extend in a second direction. In an embodiment, a width of a top surface of the first field insulating layer DB in the second direction may be at least twice of a width of the top surface of the above-described first field insulating layer SDB in the second direction. A width of the top surface of the first field insulating layer DB in the first direction may be greater than a shortest distance between gate lines GL in the first direction. Thus, the first field insulating layer DB may be called a "double diffusion break region." Thus, while the diffusion break regions in both the first region P and the second region N may both be double diffusion break regions, they have different structures.

In an embodiment, the first field insulating layer DB may include a first portion DB1, a second portion DB2, and a third portion DB3. Portions of the first portion DB1 and the second portion DB2 may extend downward, e.g., along the third direction towards the substrate 101, and be between the first active fin F1 and device isolation layers STI and DTI. Alternatively, the portions of the first portion DB1 and the second portion DB2 may extend further downward and be between the first active fin F1, the first active region AR1, and the device isolation layers STI and DTI. The third portion DB3 may be between the first portion DB1 and the second portion DB2, e.g., may extend therebetween along the first direction. The third portion DB3 may be formed by extending an upper portion of the second portion DB2 in a direction toward the second portion DB2 and extending an upper portion of the second portion DB2 in a direction toward the first portion DB1. In an embodiment, a bottom surface of the third portion DB3 may be at a higher level than a top end of the first active fin F1. The first active fin F1, source and drain regions 120, and a first interlayer insulating layer 130 may be between the first portion DB1 and the second portion DB2, and under the third portion DB3. As an example, the bottom surface of the third portion DB3 may have a convex or U shape.

In an embodiment, each of two gate lines GLB may be spaced to be apart from the first field insulating layer DB in the second direction and in a second region N. The two gate lines GLB may be spaced apart from each other and parallel to each other in the first direction. Short-axial sidewalls Sg of the two gate lines GLB, which extend in the first direction, may face short-axial sidewalls Sd of the first field insulating layer DB. For example, a first of the two gate lines GLB may extend linearly from the first portion DB1 of the first field insulating layer DB, and a second of the two gate lines GLB may extend linearly from the second portion DB2 of the first field insulating layer DB.

The gate isolation layer IG may be in the second direction on the device isolation layers STI and DTI between the first field insulating layer DB and the gate line GLB. The gate isolation layer IG may be between the first portion DB1 of the first field insulating layer DB and the gate line GLB, and may form a line with the first portion DB1, e.g., may overlap along the second direction. Further, the gate isolation layer IG may be between the second portion DB2 of the first field insulating layer DB and the gate line GLB in a straight line along with the second portion DB2 e.g., may overlap along the second direction. One side surface Sig1 of the gate isolation layer IG may be in contact with the first portion DB1, and another side surface Sig2 of the gate isolation layer IG may be in contact with the gate line GLB.

The side surface Sig1 of the gate isolation layer IG may be in contact with the first portion DB1 and the second portion DB2 of the first field insulating layer DB. The side surface Sig2 of the gate isolation layer IG may be in contact with a gate insulating layer 116*b* and a gate capping layer 117*b*.

Gate spacers 114 may include the pairs of outer gate spacers 114*a*, 114*b*, and 114*c* and pairs of gate inner gate spacers 114*a'*, 114*b'*, and 114*c'*. The pairs of outer gate spacers 114*a*, 114*b*, and 114*c* may extend in the second direction over the first region P and the second region N. The pairs of outer gate spacers 114*a*, 114*b*, and 114*c* may include first outer gate spacers 114*a*, second outer gate spacers 114*b*, and third outer gate spacers 114*c*. The first outer gate spacers 114*a* may be cover both outer sidewalls, which may extend in the second direction, of the first field insulating layer DB. That is, the first outer gate spacers 114*a* may cover outer sidewalls of the first portion DB1 and outer sidewalls of the second portion DB2 of the first field insulating layer DB. When viewed from above, e.g., in plan view, the first field insulating layer DB may be between the first outer gate spacers 114*a*.

The second outer gates spacers 114*b* may cover outer sidewalls of the gate line GLB. The third outer gate spacers 114*c* may cover outer sidewalls of the gate isolation layer IG. The first outer gate spacers 114*a* may be connected to the third outer gate spacers 114*c*, and the second outer gate spacers 114*b* may be connected to the third outer gate spacers 114*c* so that the first to third outer gate spacers 114*a*, 114*b*, and 114*c* may integrally form outer gate spacers.

The pairs of inner gate spacers 114*a'*, 114*b'*, and 114*c'* may extend in the second direction over the first region P and the second region N. The pairs of inner gate spacers 114*a'*, 114b', and 114c' may include first inner gate spacers 114a', second inner gate spacers 114b', and third inner gate spacers 114c'. The first inner gate spacers 114a may cover inner side surfaces of the first field insulating layer DB. That is, the first inner gate spacers 114a may cover an inner side surface of the first portion DB1 and an inner side surface of the second portion DB2 of the first field insulating layer DB, and the first portion DB1 may be between the first outer gate spacer 114a and the first inner gate spacer 114a'. A top end of the first inner gate spacer 114a' may be in contact with the bottom surface of the third portion DB3 of the first field insulating layer DB. The top end of the first inner gate spacer 114a' may be at a lower level than a top end of the first outer gate spacer 114a.

The second inner gate spacers 114b' may cover inner sidewalls of the gate line GLB, and the gate line GLB may be between the second outer gate spacer 114b and the second inner gate spacer 114b'. A top end of the second inner gate spacer 114b' may be at a higher level than the top end of the first inner gate spacer 114a'.

The third inner gate spacers 114c' may cover inner sidewalls of the gate isolation layer IG, and the gate isolation layer IG may be between the third outer gate spacer 114c and the third inner gate spacer 114c'. A top end of the third inner gate spacer 114c' may be at the same level as top ends of the outer gate spacers 114a, 114b, and 114c. The top end of the third inner gate spacer 114c' may be at the same level as the top end of the second inner gate spacer 114b'. The first inner gate spacers 114a' may be connected to third inner gate spacers 114c', and the second inner gate spacers 114b' may be connected to the third inner gate spacers 114c' so that the first to third inner gate spacers 114a', 114b', and 114c' may integrally form inner gate spacers.

In an embodiment, one end of the third inner gate spacer 114c' may be in contact with a portion of a side surface of the first field insulating layer DB, which extends in the second direction. For example, the one end of the third inner gate spacer 114c' may be in contact with a portion of one side surface of the third portion DB3 of the first field insulating layer DB.

Referring to FIG. 2E, a semiconductor device 100b may include a first field insulating layer DB and a pair of outer gate spacers 114a in a first region P. The first field insulating layer DB may include a first portion DB1, a second portion DB2, and a third portion DB3. In an embodiment, a level LV_DB3 of a highest part of a bottom surface of the third portion DB3 may be lower than or equal to a level LV_F of a top end of a first active fin F1. The first active fin F1 and portions of the source and drain regions 120 may be between the first portion DB1 and the second portion DB2 and under the third portion DB3. As an example, the bottom surface of the third portion DB3 may have a concave or inverted U shape.

The pair of outer gate spacers 114a may be respectively on outer sidewalls of the first portion DB1 and the second portion DB2. Unlike that which is shown in FIG. 2C, a pair of inner gate spacers may be only on inner sidewalls of a gate isolation layer and a gate line, e.g., may not be on inner sidewalls of the first field insulating layer DB.

Figure 3A:
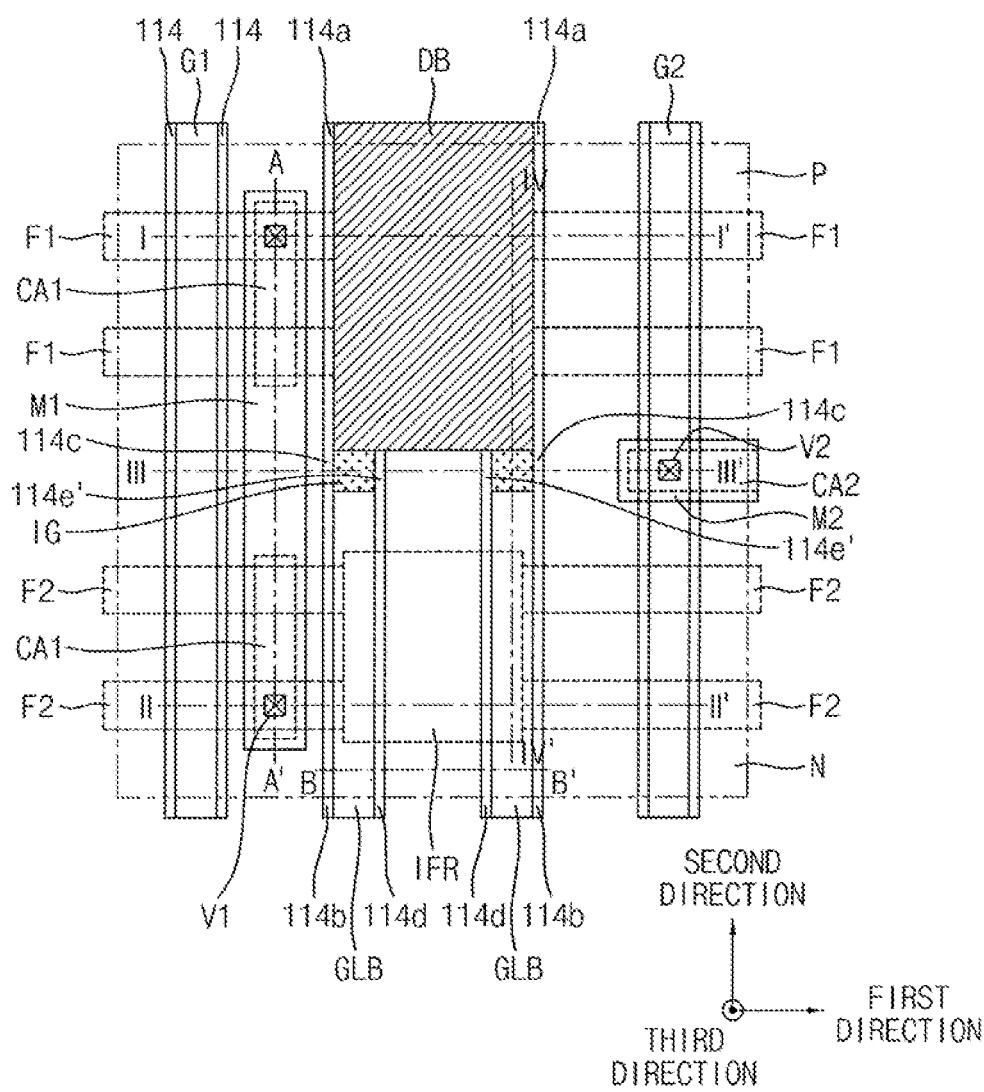
FIGS. 3A to 3D illustrate views of a semiconductor device according to an embodiment.
Figure 3B:
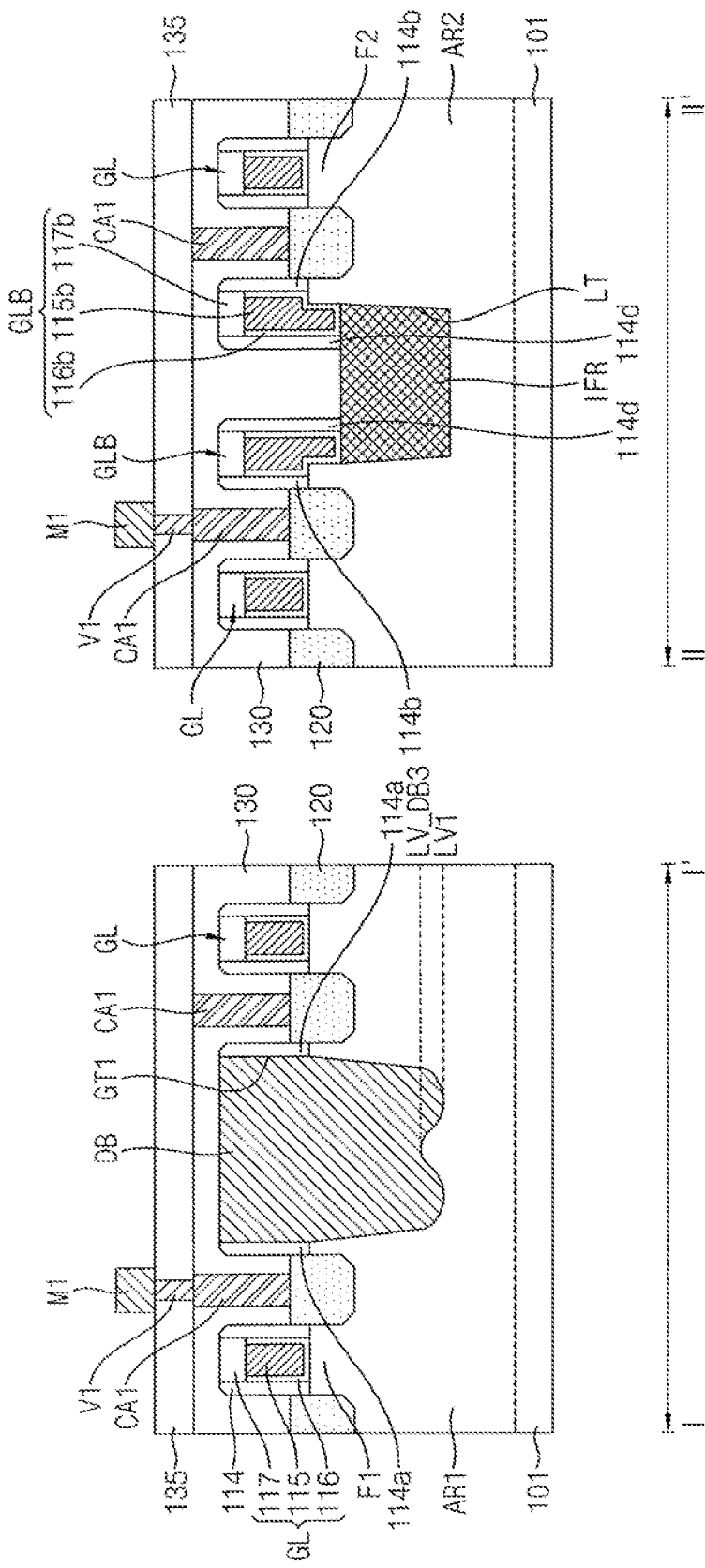
Figure 3C:
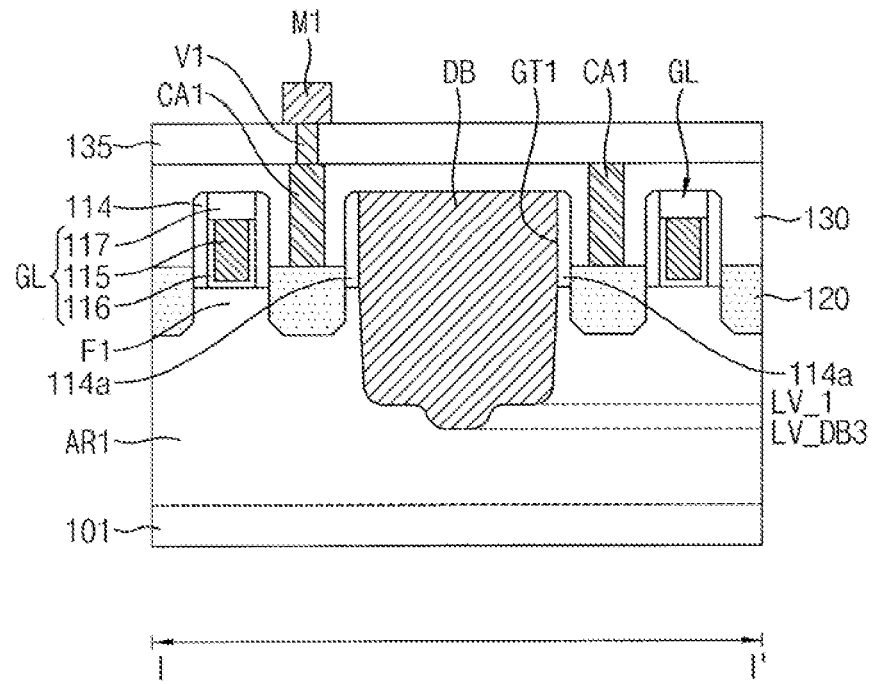
Figure 3D:
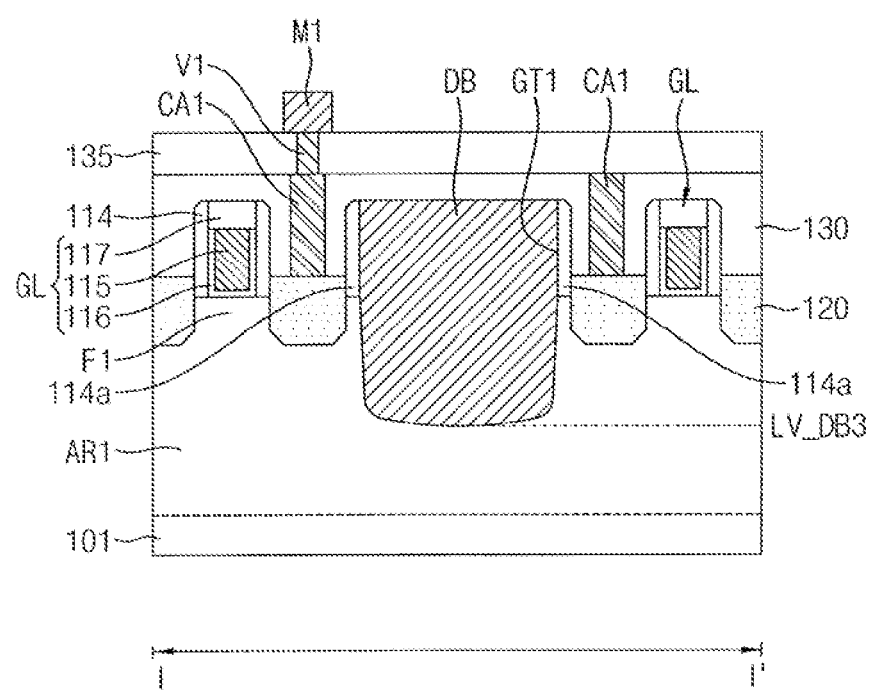

FIG. 3A schematically illustrates a layout of a partial region of a semiconductor device according to an embodiment. FIG. 3B shows vertical cross-sectional views taken along lines I-I' and II-II' of FIG. 3A. FIGS. 3C and 3D show vertical cross-sectional views taken along the line I-I' of FIG. 3A, according to embodiments. Hereinafter, the same descriptions as in FIGS. 1A to 2E will be omitted for brevity.

Referring to FIGS. 3A and 3B, a semiconductor device 100c may include a first field insulating layer DB and a pair of inner gate spacers 114d and 114e. In an embodiment, the first field insulating layer DB may have a relatively large width in a first direction in a first region P. For instance, a width of a top surface of the first field insulating layer DB in the first direction may be at least twice of a width of a gate line GL. In an embodiment, a bottom surface of the first field insulating layer DB may have a curved shape. For example, a middle portion of the bottom surface of the first field insulating layer DB may have a concavely indented shape upward. Thus, the middle portion of the bottom surface of the first field insulating layer DB may be at a level LV_DB3 higher than a level LV1 of a lowermost end of the first field insulating layer DB. The bottom surface of the first field insulating layer DB may be formed by further extending the third portion DB3 of FIG. 2E further downward.

The pair of inner gate spacers 114d and 114e may extend in the second direction in a second region N, and portions of the pair of inner gate spacers 114d and 114e may be in the first region P. The pair of inner gate spacers 114d and 114e may include a first inner gate spacer 114d and a second inner gate spacer 114e. The first inner gate spacer 114d may be in contact with an inner side surface of the gate line GLB in the second region N. The second inner gate spacer 114e may be in contact with an inner side surface of the gate isolation layer IG in the first region P and the second region N. The first inner gate spacer 114d may be connected to the second inner gate spacer 114e to integrally form a spacer. In an embodiment, one ends of the pair of inner gate spacers 114d and 114e may be in contact with a first side surface of the first field insulating layer DB. That is, a first end of the second inner gate spacer 114e may be in contact with one side surface of the first field insulating layer DB.

Referring to FIG. 3C, the bottom surface of the first field insulating layer DB may have a curved shape. For example, a middle portion of the bottom surface of the first field insulating layer DB may have a convexly protruding shape downward. Thus, the middle portion of the bottom surface of the first field insulating layer DB may be at the level LV_DB3 lower than the level LV1 of the lowermost end of the first field insulating layer DB.

Referring to FIG. 3D, the bottom surface of the first field insulating layer DB may be a curved surface, e.g., a continuously convex surface having a base at the level LV_DB3, or may be a flat planar surface.

FIGS. 4A to 10B are diagrams illustrating stages in a method of manufacturing a semiconductor device according to an embodiment. In particular, FIGS. 4A, 5A, 6A, 7A, 8A, and 9A illustrate a layout of a partial region of a semiconductor device according to an embodiment. FIGS. 4B, 5B, 6B, 7B, 8B, 9B, and 10A illustrate vertical cross-sectional views taken along lines I-I' and II-II'. FIGS. 4C, 5C, 6C, 7C, 8C, 9C, and 10B illustrate vertical cross-sectional views taken along lines and IV-IV'. In FIGS. 1A to 10B, like numbers refer to like elements. Hereinafter, the same descriptions as in FIGS. 1A to 3D will be omitted for brevity.

Figure 4A:
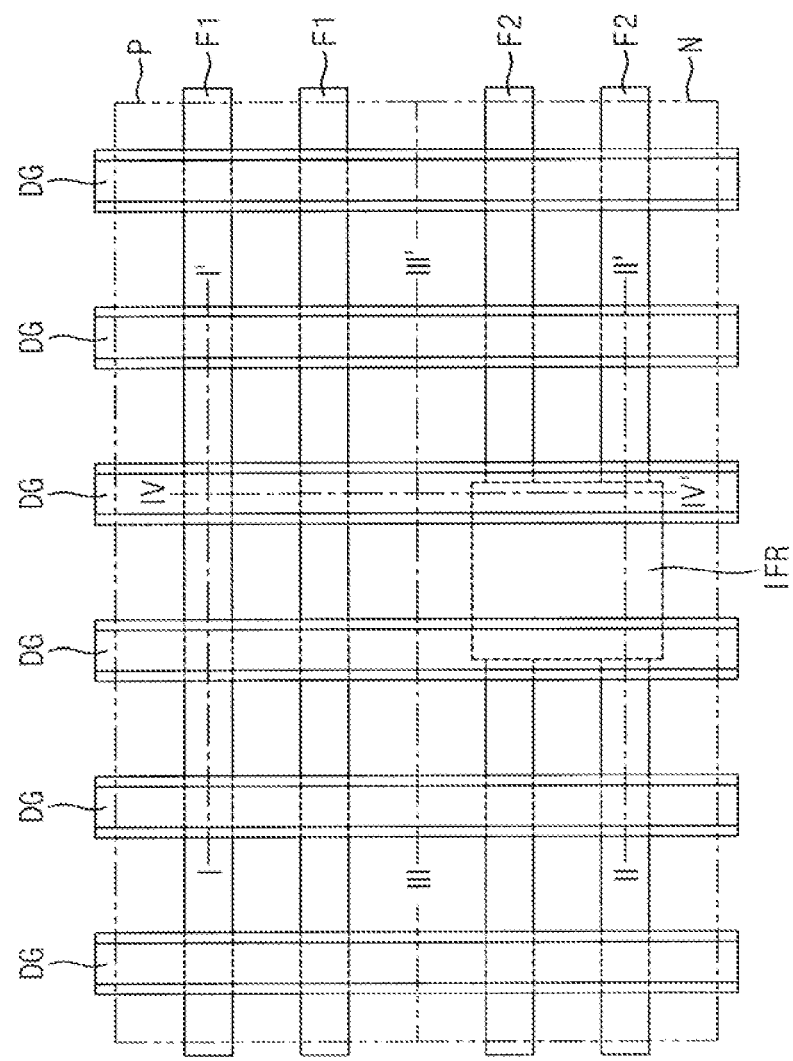
FIGS. 4A to 10B illustrate stages in a method of manufacturing a semiconductor device according to an embodiment.
Figure 4B:
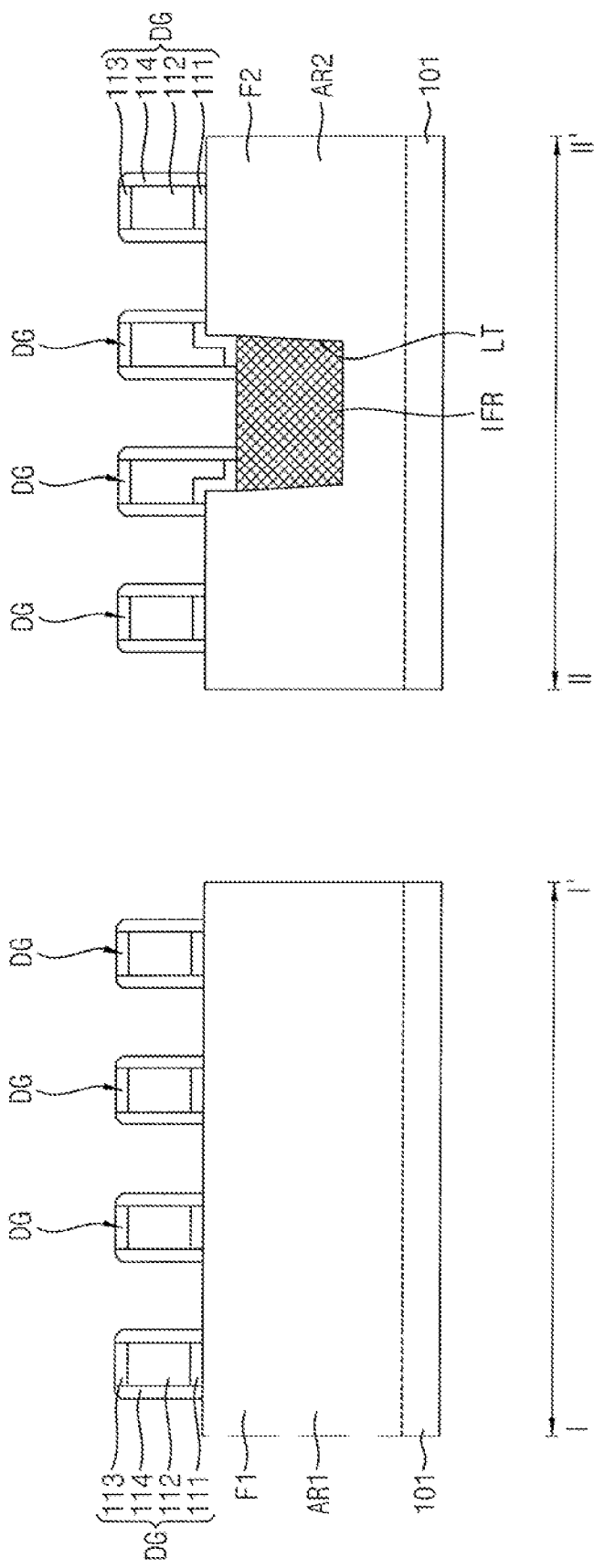
Figure 4C:
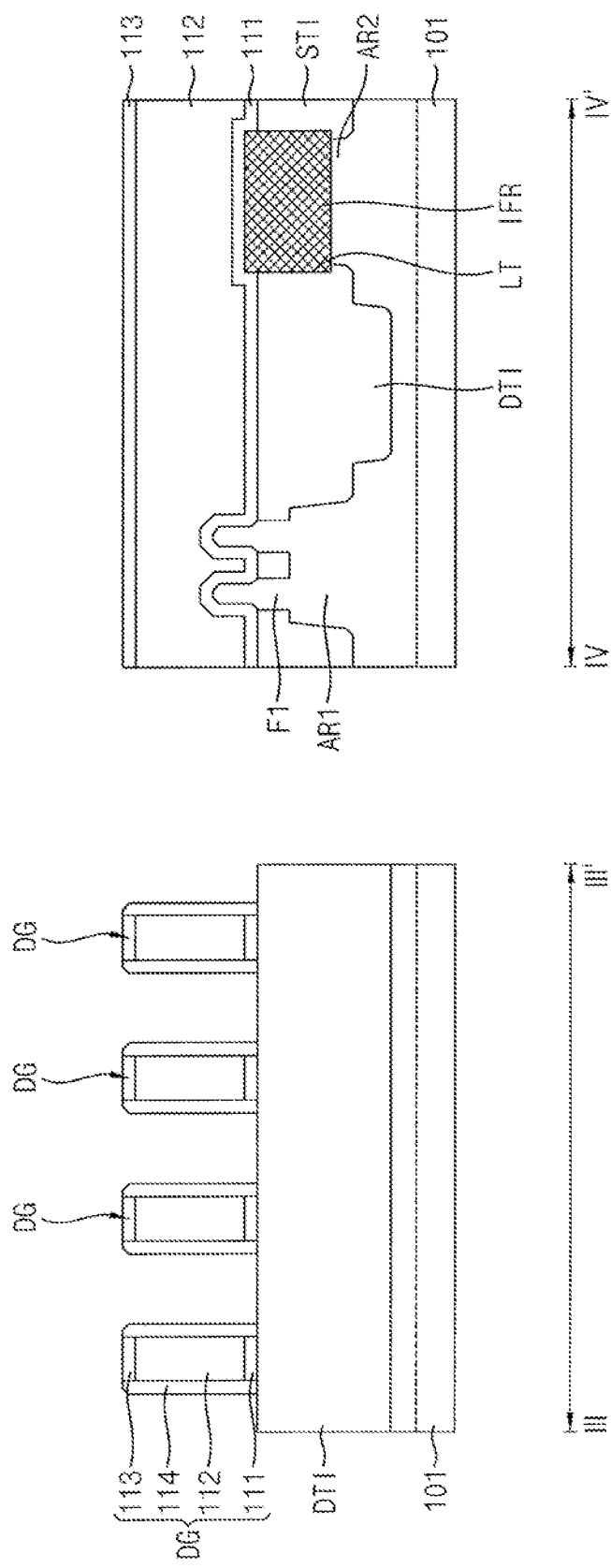

Referring to FIGS. 4A to 4C, a substrate 101 may be partially etched to form active regions AR1 and AR2 and active fins F1 and F2. Along the second direction, widths of the active regions AR1 and AR2 and the active fins F1 and F2 may be gradually reduced upward, e.g., along the third direction away from the substrate 101, while the widths of a bottom surface of the active fins F1 and F2 may be stepwise smaller than widths of an upper surface of the active regions AR1 and AR2. An insulating film may be formed on the substrate 101 to cover the active regions AR1 and AR2 and the active fins F1 and F2. The insulating film may then be partially removed to form device isolation layers STI and DTI. In an embodiment, an etchback process for partially removing the insulating film may be performed to leave the device isolation layers STI and DTI. After the device isolation layers STI and DTI are formed, the active fins F1 and F2 may protrude along the third direction from top surfaces of the device isolation layers STI and DTI to be exposed. As an example, the device isolation layers STI and DTI may be formed of silicon oxide, silicon nitride, silicon oxynitride, a combination thereof, or the like.

Thereafter, the device isolation layers STI and DTI, the active fins F1 and F2, and the second active region AR2 may be partially etched in the second region N, thereby forming a lower trench LT. The lower trench LT may be formed by performing an etching process using a mask layer that covers the device isolation layers STI and DTI and the first active fins F1 in the first region P, and partially exposes the device isolation layers STI and DTI and the second active fins F2 in the second region N. Thus, the lower trench LT is only in the second region N. The second field insulating layer IFR may be formed inside the lower trench LT. After the lower trench LT is filled with a second field insulating layer IFR, the mask layer may be removed.

A dummy gate structure DG may be formed on the active fins F1 and F2 and the device isolation layers STI and DTI and extend across the active fins F1 and F2. A portion of the dummy gate structure DG may also extend across the second field insulating layer IFR in the second region N. For example, the dummy gate structure DG may extend to completely cover the second field insulating layer IFR along the second direction, while, along the first direction, the dummy gate structure DG may overlap a portion of the second field insulating layer IFR and the second active fins F2.

The dummy gate structure DG may include dummy gate lines 111, 112, and 113, and gate spacers 114. The dummy gate lines 111, 112, and 113 may include a dummy gate insulating layer 111, a dummy gate electrode 112, and a dummy gate capping layer 113, which are sequentially stacked. The dummy gate insulating layer 111 may include silicon oxide and may be formed using a method such as a CVD process or an ALD process. The dummy gate electrode 112 may include polysilicon. The dummy gate capping layer 113 may be formed of silicon oxide, silicon nitride, silicon oxynitride or a combination thereof. The gate spacers 114 may be on both sidewalls of the dummy gate structure DG. That is, the gate spacers 114 may be on both sidewalls of the dummy gate insulating layer 111, the dummy gate electrode 112, and the dummy gate capping layer 113. The gate spacers 114 may be formed of silicon nitride, silicon oxynitride, a combination thereof, or the like.

Figure 5A:
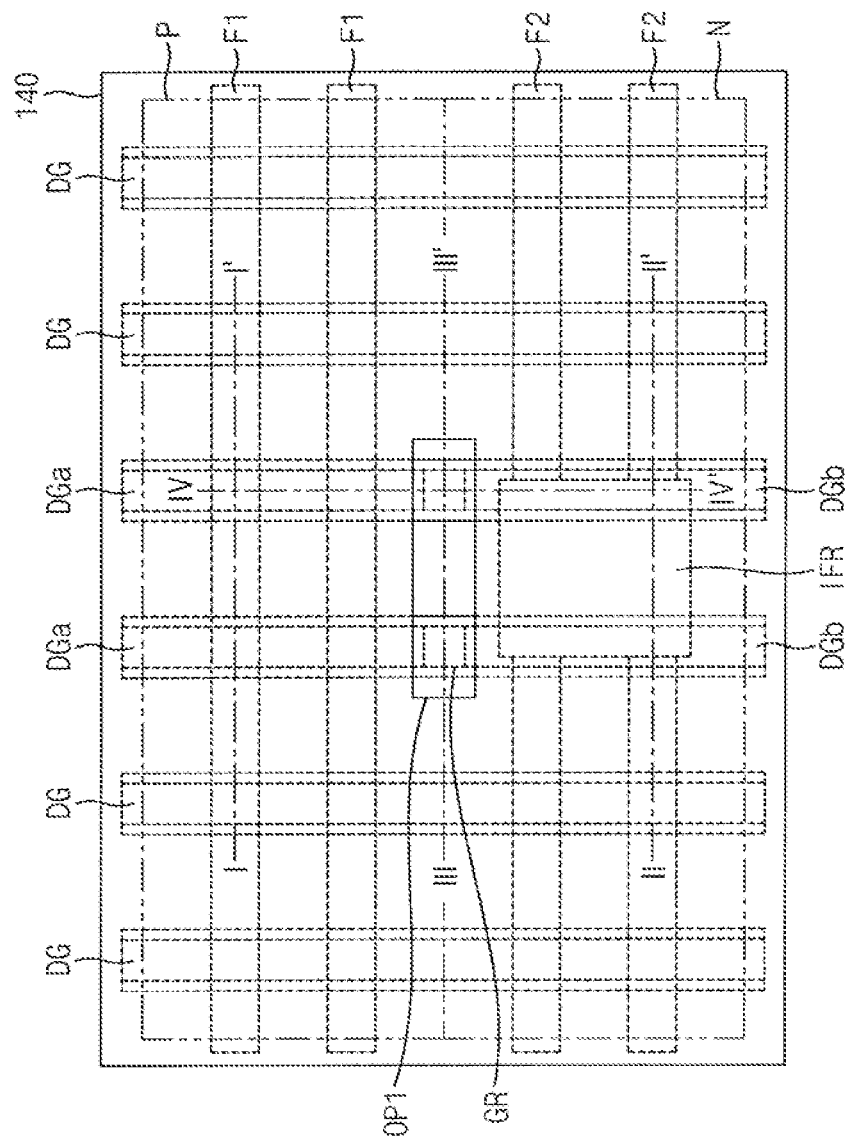
Figure 5B:
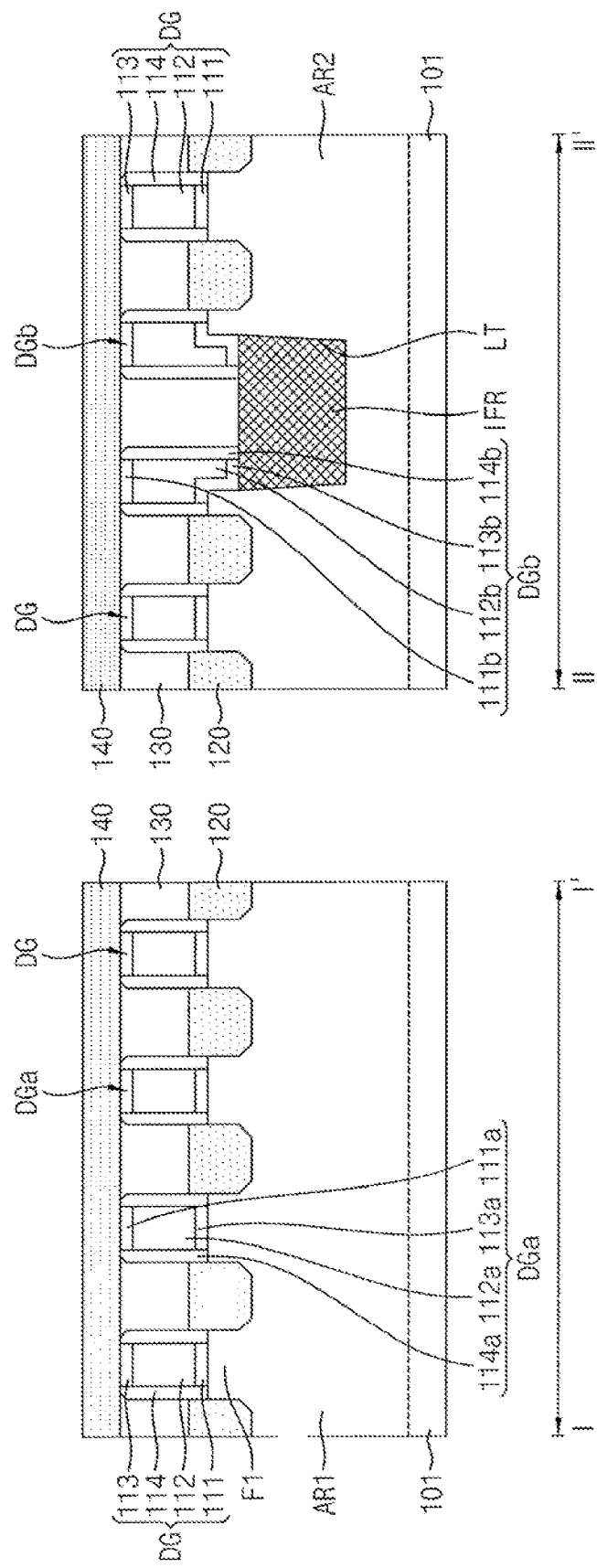
Figure 5C:
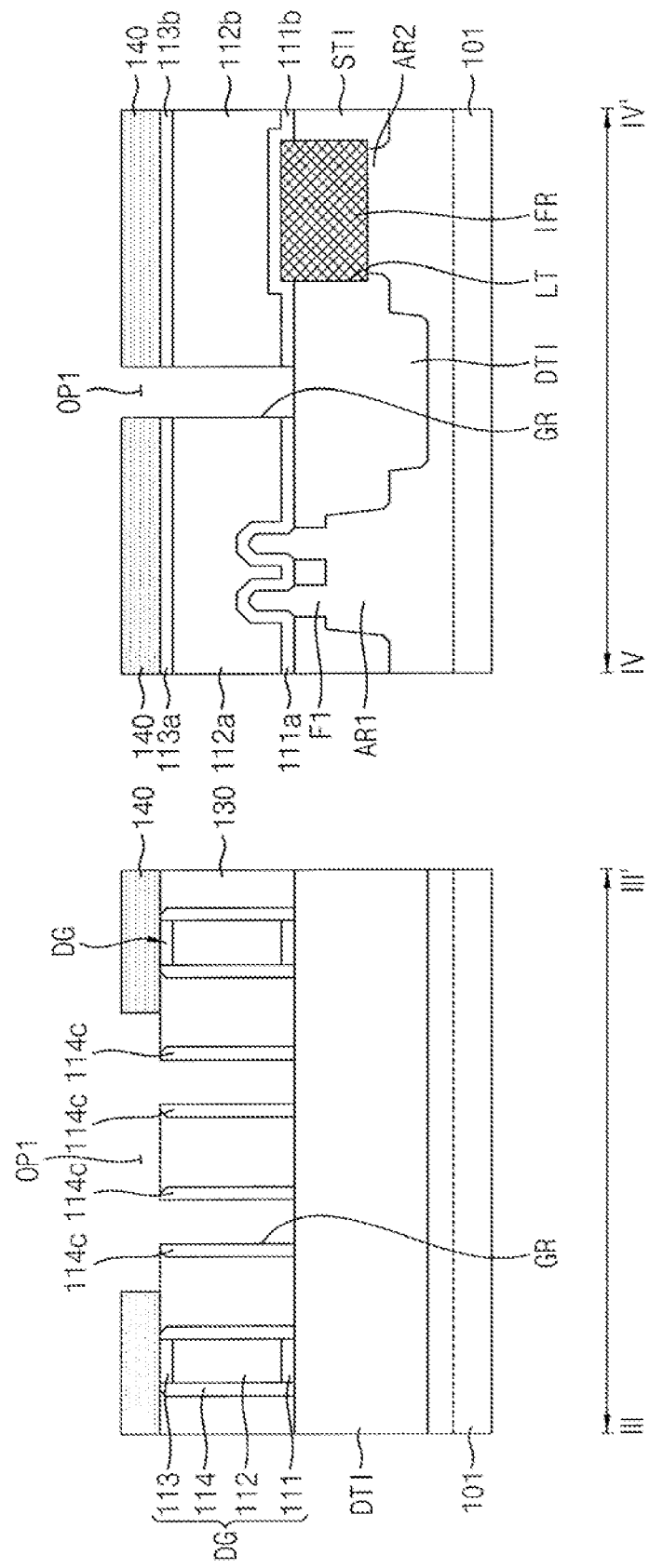

Referring to FIGS. 5A to 5C, source and drain regions 120 may be formed on the active fins F1 and F2 on both sides of the dummy gate structure DG. Exposed portions of the active fins F1 and F2, which are not covered by the dummy gate structure DG, may be removed to form recesses. Thereafter, the source and drain regions 120 may be formed in the recesses by using an epitaxial growth process.

Subsequently, a first interlayer insulating layer 130 may be formed to cover the active fins F1 and F2, the device isolation layers STI and DTI, the second field insulating layer IFR, and the dummy gate structure DG. A planarization process, e.g. a chemical mechanical polishing (CMP) process, an etchback process, or the like, may be performed so that a top surface of the first interlayer insulating layer 130 may be at the same level as a top surface of the dummy gate structure DG, e.g., along the third direction from the substrate 101. A mask layer 140 may be formed to cover the planarized first interlayer insulating layer 130 and the planarized dummy gate structure DG. A portion of the mask layer 140 may be etched to form an open region OP1 exposing top surfaces of at least two adjacent dummy gate structures DG, e.g., at a center of an interface of the first region P and the second region N. The open region OP1 may extend in the first direction. The top surface of the first interlayer insulating layer 130 may also be exposed through the open region OP1.

An etching process may be performed using the mask layer 140, the first interlayer insulating layer 130, and the gate spacers 114 as etch masks. The dummy gate insulating layer 111, the dummy gate electrode 112, and the dummy gate capping layer 113 of which top surfaces are exposed by the open region OP1 may be partially removed due to the etching process. Thus, adjacent dummy gate line 111, 112, and 113 exposed by the open region OP1 may be separated into a first dummy gate line 111a, 112a, and 113a, and a second dummy gate line 111b, 112b, and 113b. The gate spacer 114 may be divided into a first gate spacer 114a in contact with the first dummy gate line 111a, 112a, and 113a, a second gate spacer 114b in contact with the second dummy gate line 111b, 112b, and 113b, and a third gate spacer 114c having inner side surfaces exposed between the first gate spacer 114a and the second gate spacer 114b. Further, the dummy gate structure DG, which is partially removed due to the etching process, may be divided into a first dummy gate structure DGa and a second dummy gate structure DGb. In particular, the first dummy gate structure DGa extends along the second direction from the open region OP1 towards an outer edge of the first region P, while the second dummy gate structure DGb extends along the second direction from the open region OP1 towards an outer edge of the second region N.

A gate recess region GR exposing a portion of the top surface of the device isolation layers STI and DTI may be formed between the third gate spacers 114c in the first direction, and between the first dummy gate lines 111a, 112a, and 113a, and the second dummy gate lines 111b, 112b, and 113b in the second direction. A first side surface of the first dummy gate insulating layer 111a, a first side surface of the first dummy gate electrode 112a, and a first side surface of the first dummy gate capping layer 113a may be exposed by the gate recess region GR. In addition, a second side surface of the second dummy gate insulating layer 111b, a second side surface of the second dummy gate electrode 112b, and a second side surface of the second dummy gate capping layer 113b may be exposed by the gate recess region GR. Furthermore, inner side surfaces of the third gate spacers 114c may be exposed by the gate recess region GR.

Figure 6A:
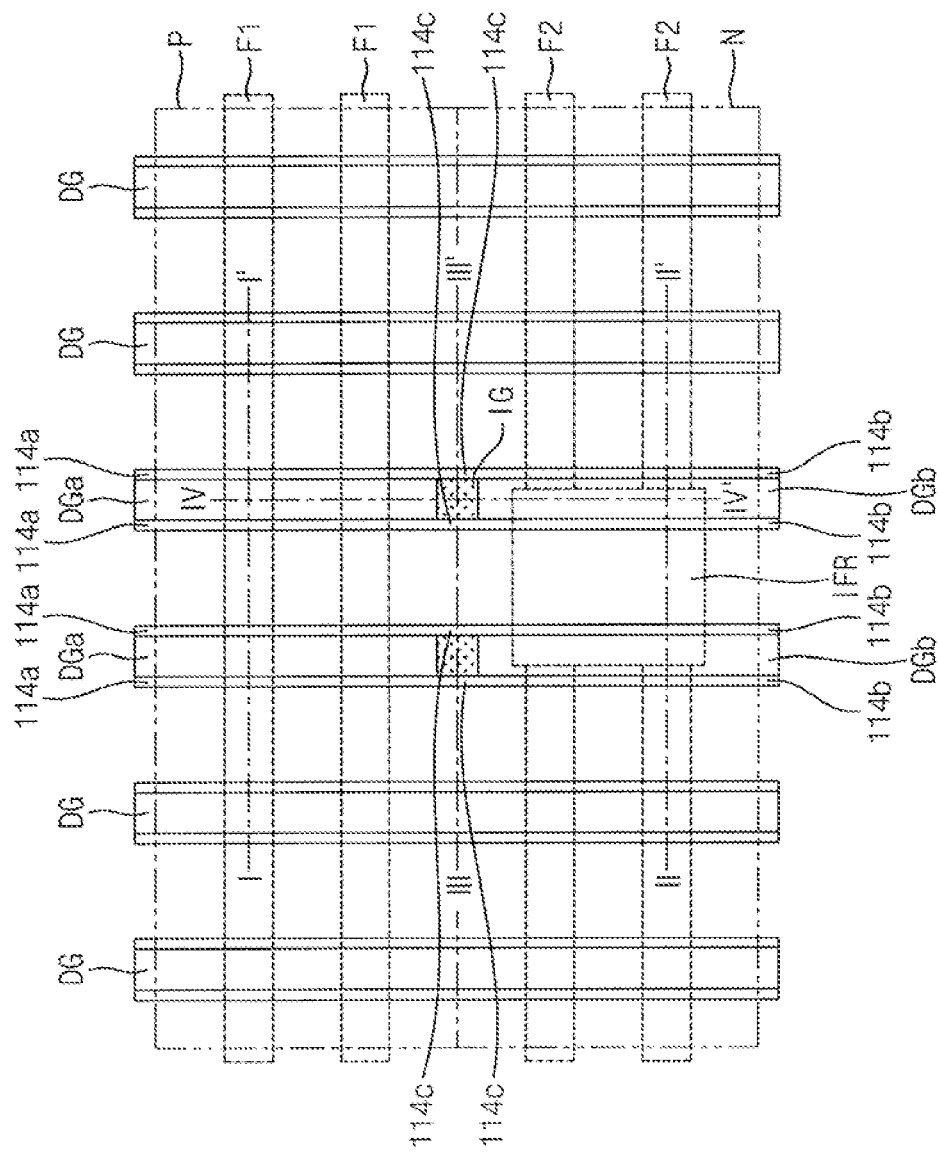
Figure 6B:
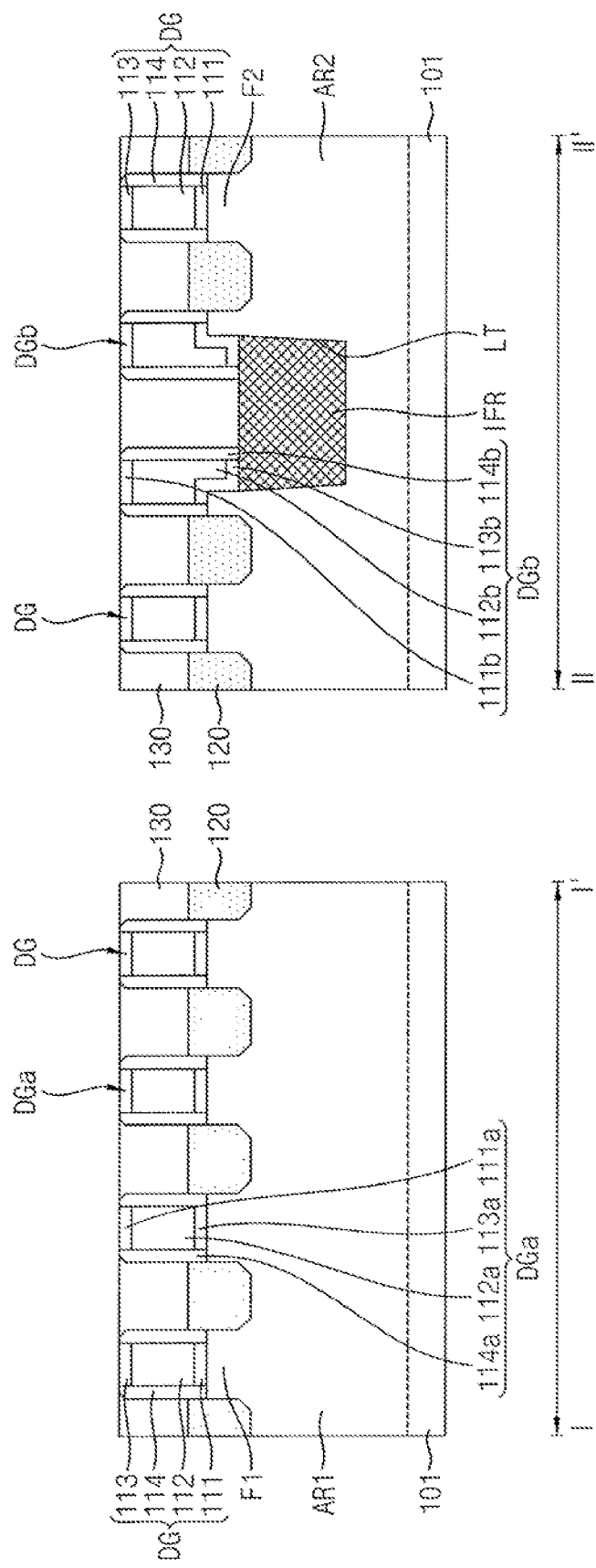
Figure 6C:
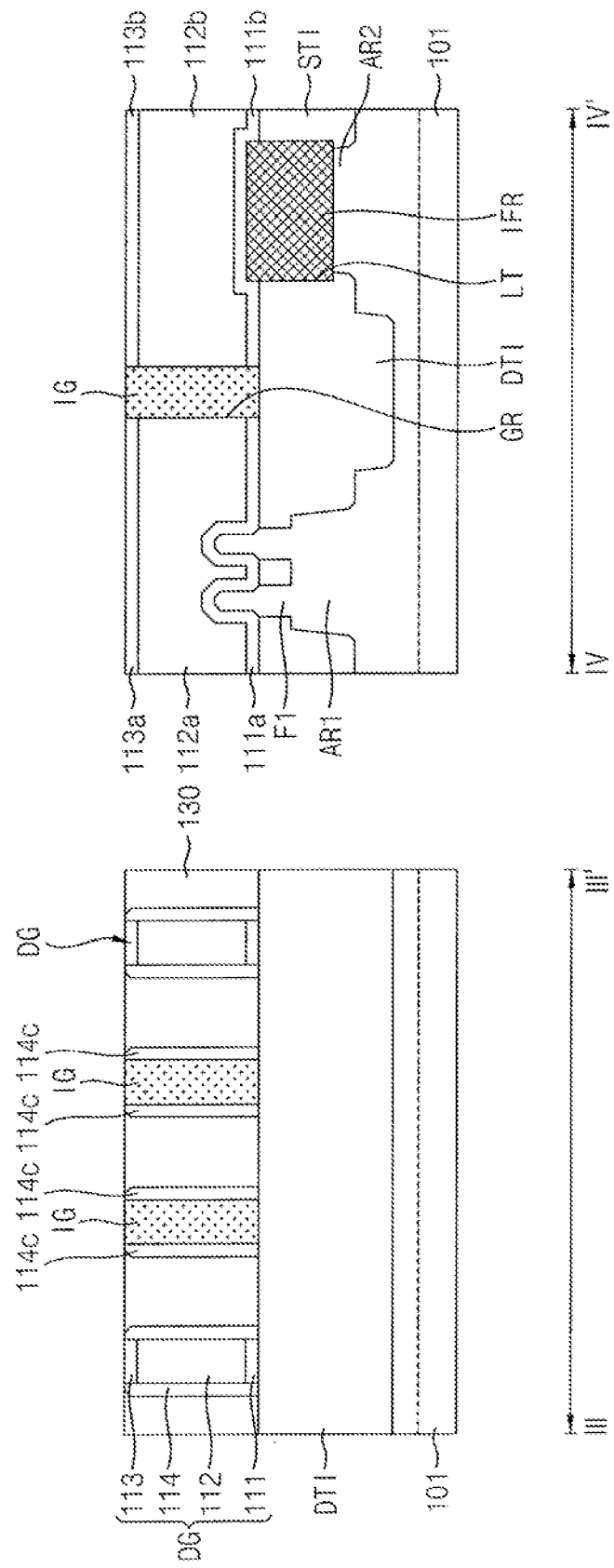

Referring to FIGS. 6A to 6C, the mask layer 140 may be removed to expose the top surface of the dummy gate structure DG, DGa, and DGb, and the top surface of the first interlayer insulating layer 130. A gate isolation layer IG may be formed to fill the gate recess region GR. The formation of the gate isolations layer IG may include depositing an insulating material to such a sufficient thickness for filling the gate recess region GR to cover a top surface of the first interlayer insulating layer 130, and etching back or planarizing the insulating material until the top surface of the first interlayer insulating layer 130 is exposed. In an embodiment, the gate isolation layer IG may be formed of silicon oxide, silicon nitride, air spaces, a combination thereof, or the like. The gate isolation layer IG may be in contact with the inner side surfaces of the third gate spacers 114c, the first sidewalls of the first dummy gate line 111a, 112a, and 113a, second sidewalls of the second dummy gate line 111b, 112b, and 113b, and the top surfaces of the device isolation layers STI and DTI.

Figure 7A:
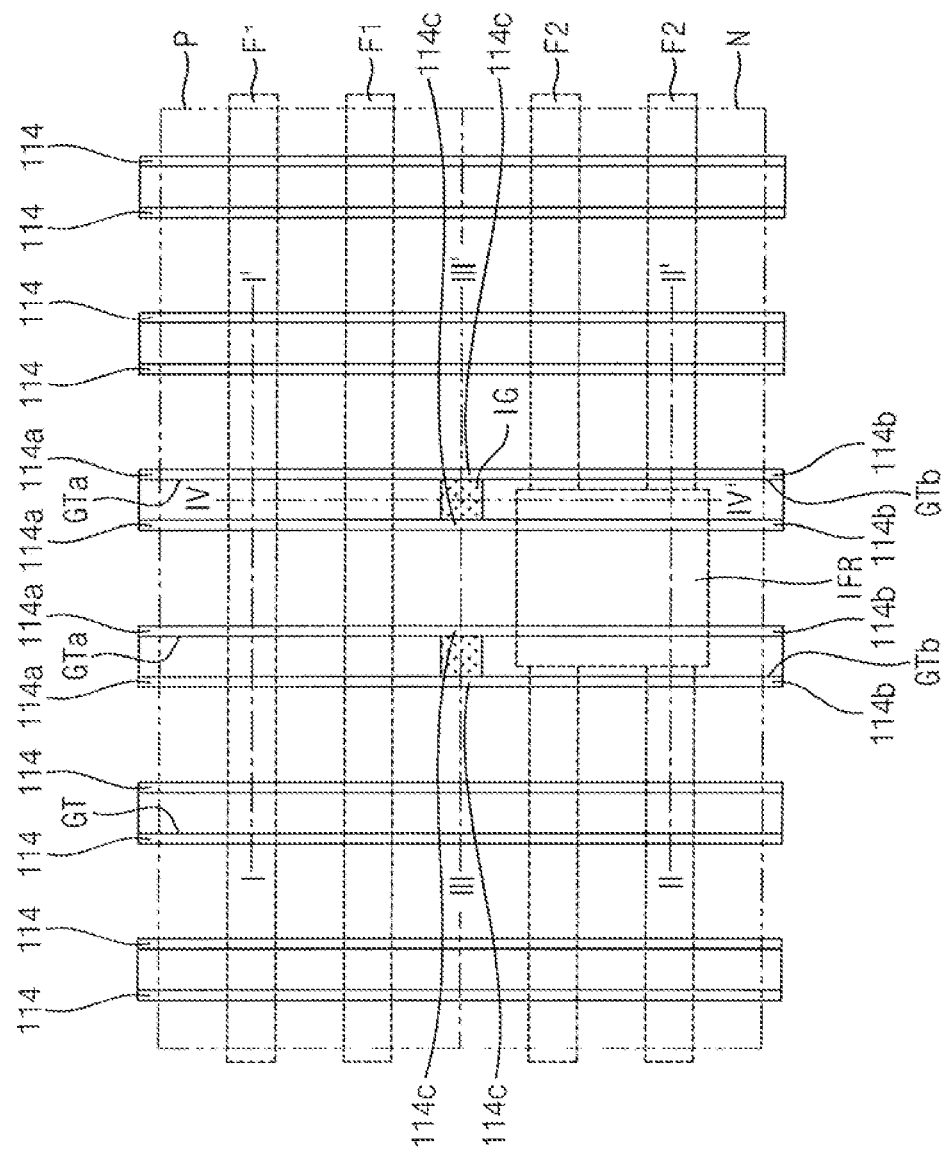
Figure 7B:
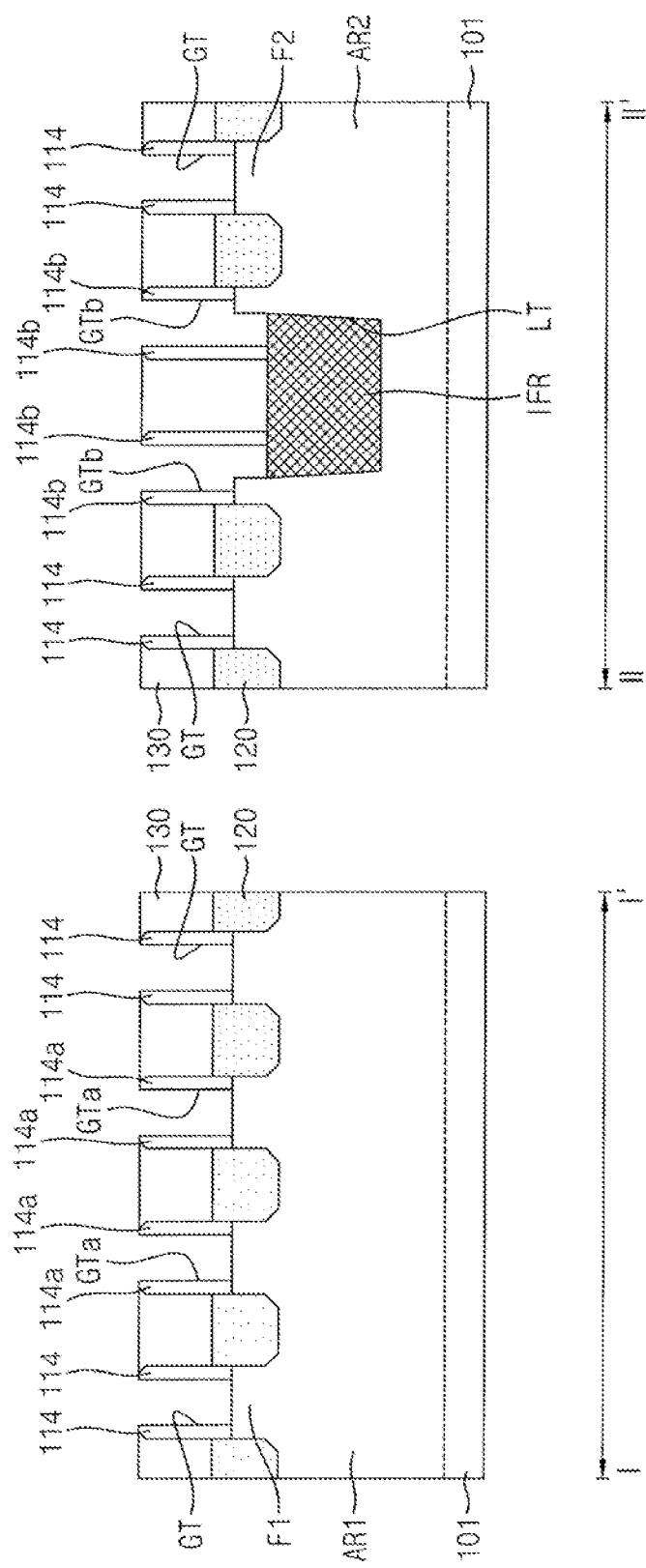
Figure 7C:
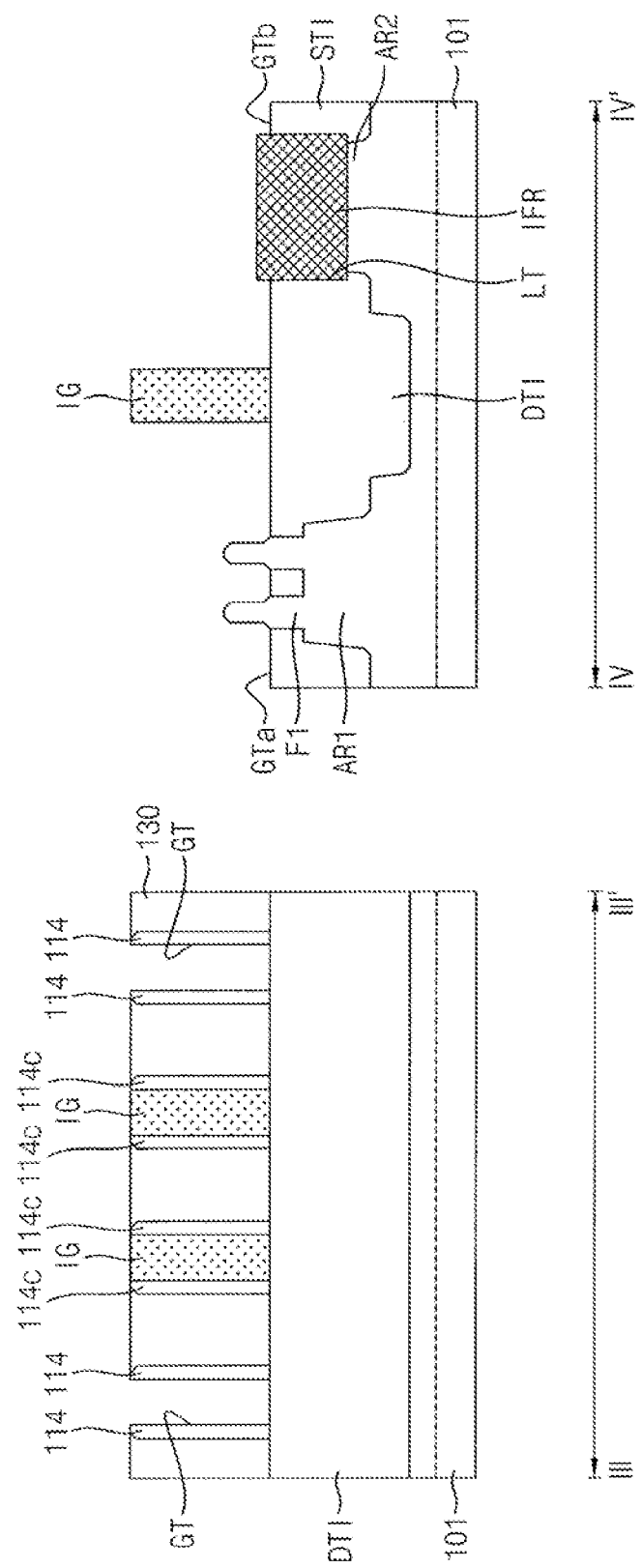

Referring to FIGS. 7A to 7C, the dummy gate lines 111, 112, and 113 may be removed to form dummy gate trenches GT. The first dummy gate lines 111a, 112a, and 113a may be removed to form first dummy gate trenches GTa, and the second dummy gate lines 111b, 112b, and 113b may be removed to form second dummy gate trenches GTb. Inner side surfaces of the first gate spacers 114a, inner side surfaces of the second gate spacers 114b, upper portions of the active fins F1 and F2, a portion of the top surfaces of the device isolation layers STI and DTI, and a part of an upper portion of the second field insulating layer IFR may be exposed by the dummy gate trench GTa and GTb. Further, both side surfaces of the gate isolation layer IG may be exposed by the dummy gate trench GTa and GTb.

Figure 8A:
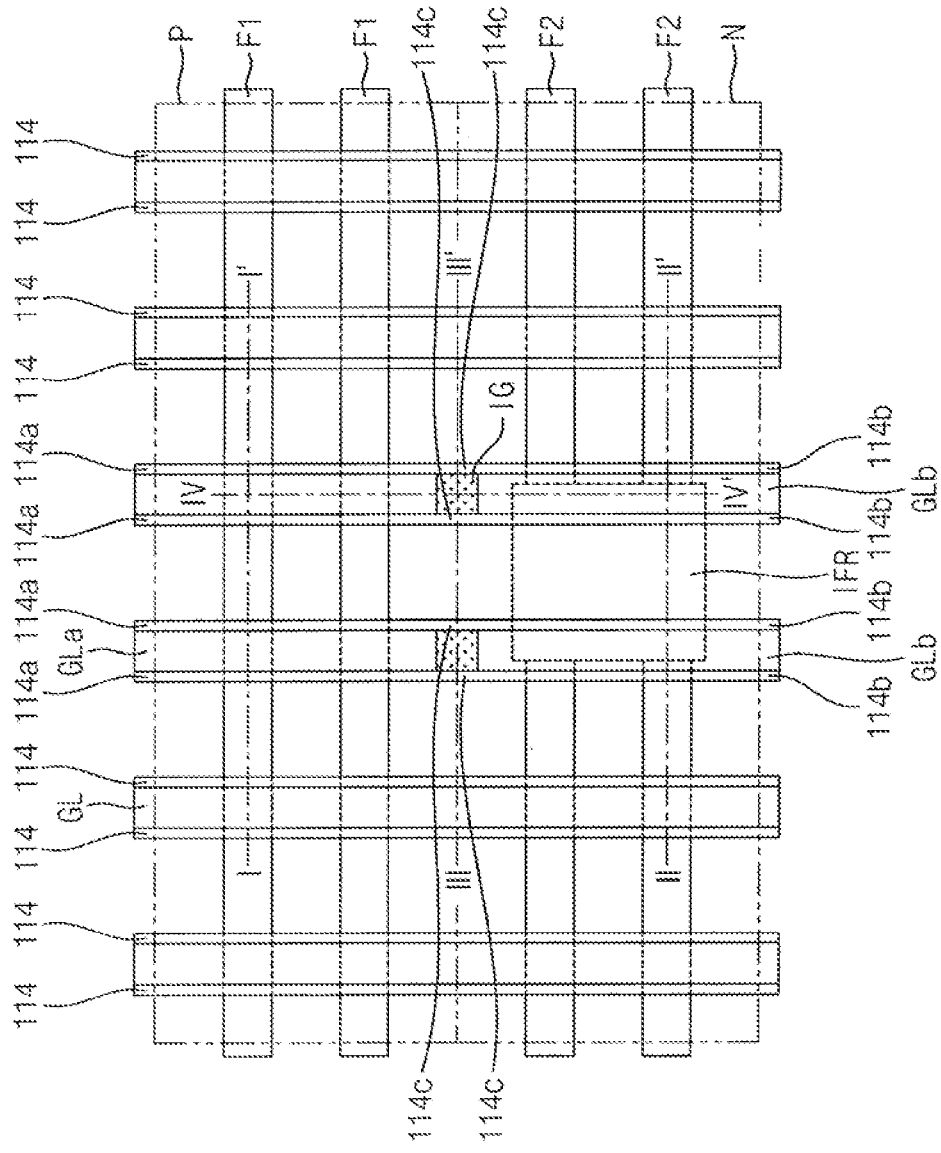
Figure 8B:
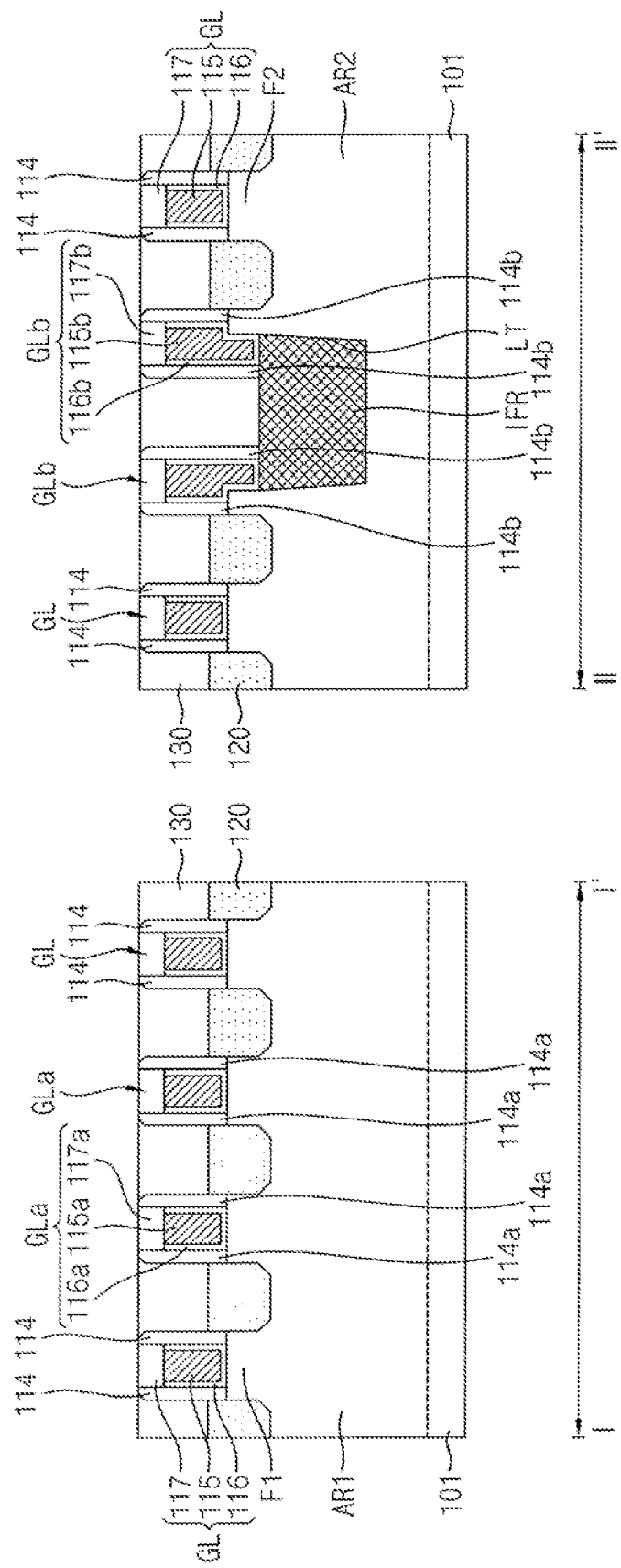
Figure 8C:
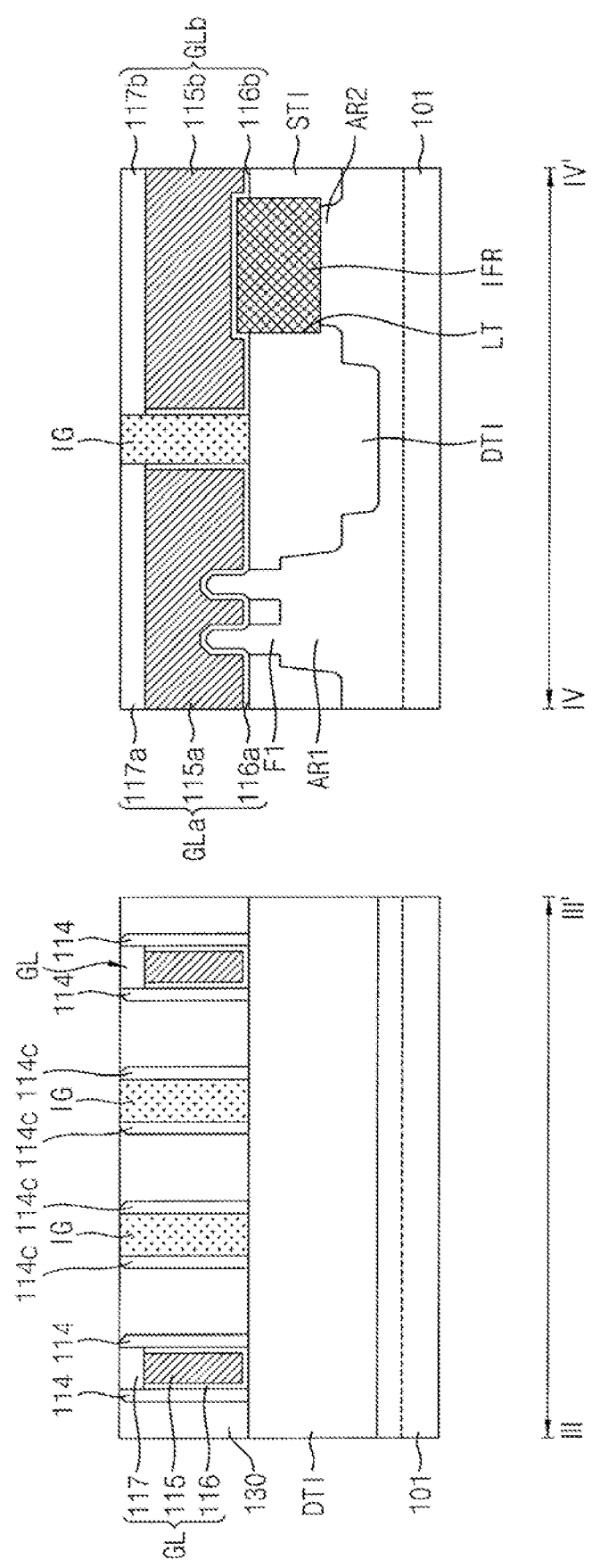

Referring to FIGS. 8A to 8C, a gate line GL may be formed inside the dummy gate trench GT. The gate electrode 115, the gate insulating layer 116, and the gate capping layer 117 may fill the dummy gate trench GT and cover the first interlayer insulating layer 130, and, then, an etchback process and a planarization process may be performed to expose top surfaces of the first interlayer insulating layer 130, the gate spacers 114 and 114c, and the gate isolation layer IG. Similarly, e.g., simultaneously, the gate electrode 115a, the gate insulating layer 116a, and the gate capping layer 117a may fill the dummy gate trench GTa, and the gate electrode 115b, the gate insulating layer 116b, and the gate capping layer 117b may fill the dummy gate trench GTb, and, the gate spacers 114a and 114b may be exposed. Thus, the first gate line GLa filling the first dummy gate trench GTa and the second gate line GLb filling the second dummy gate trench GTb may be formed with the gate isolation layer IG therebetween, e.g., along the second direction.

Figure 9A:
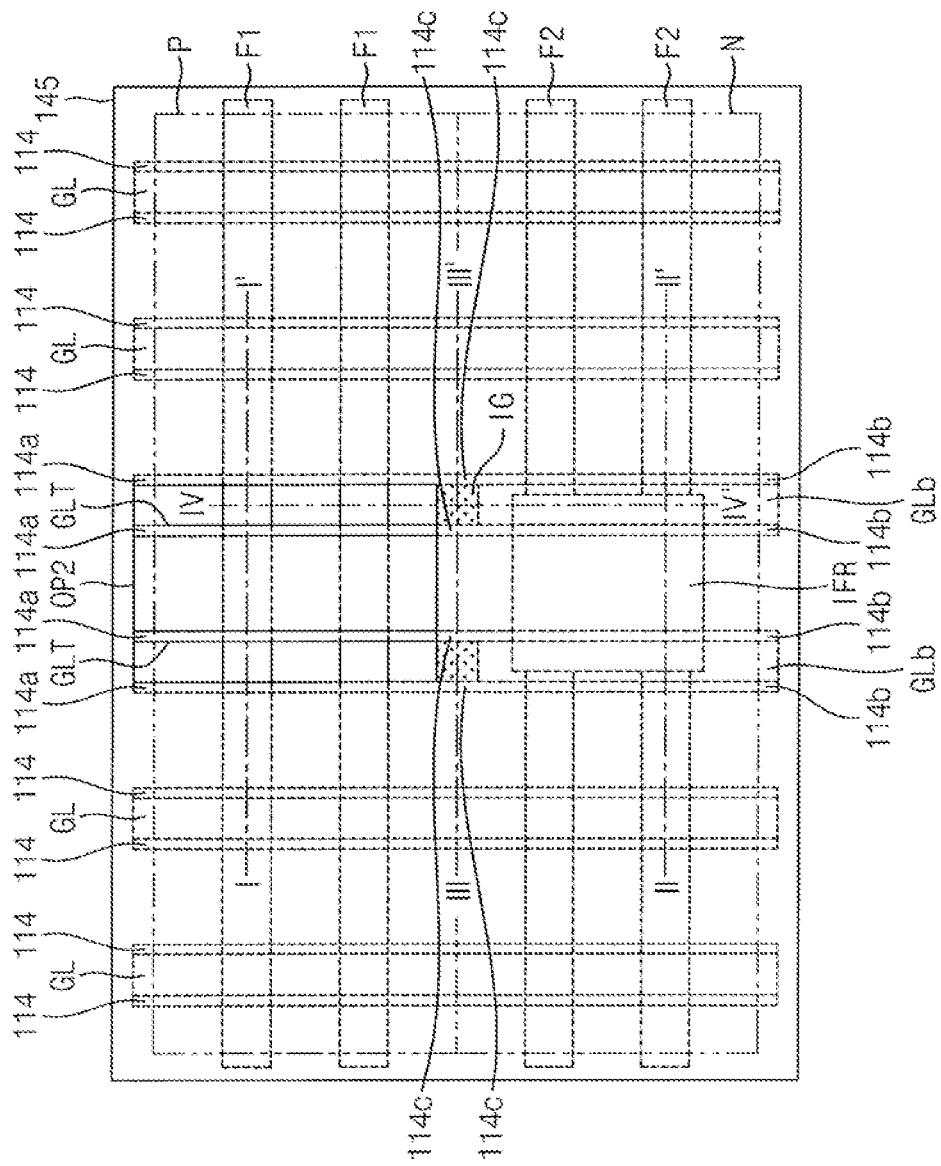
Figure 9B:
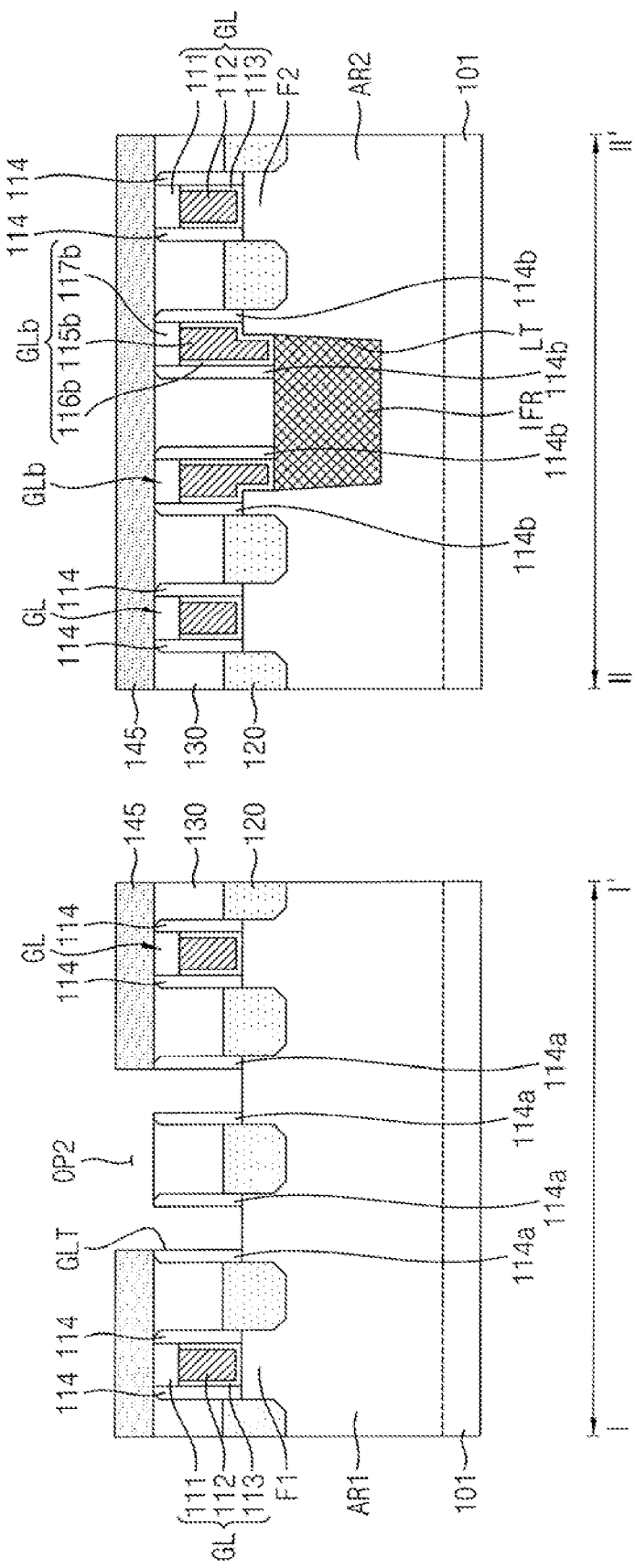
Figure 9C:
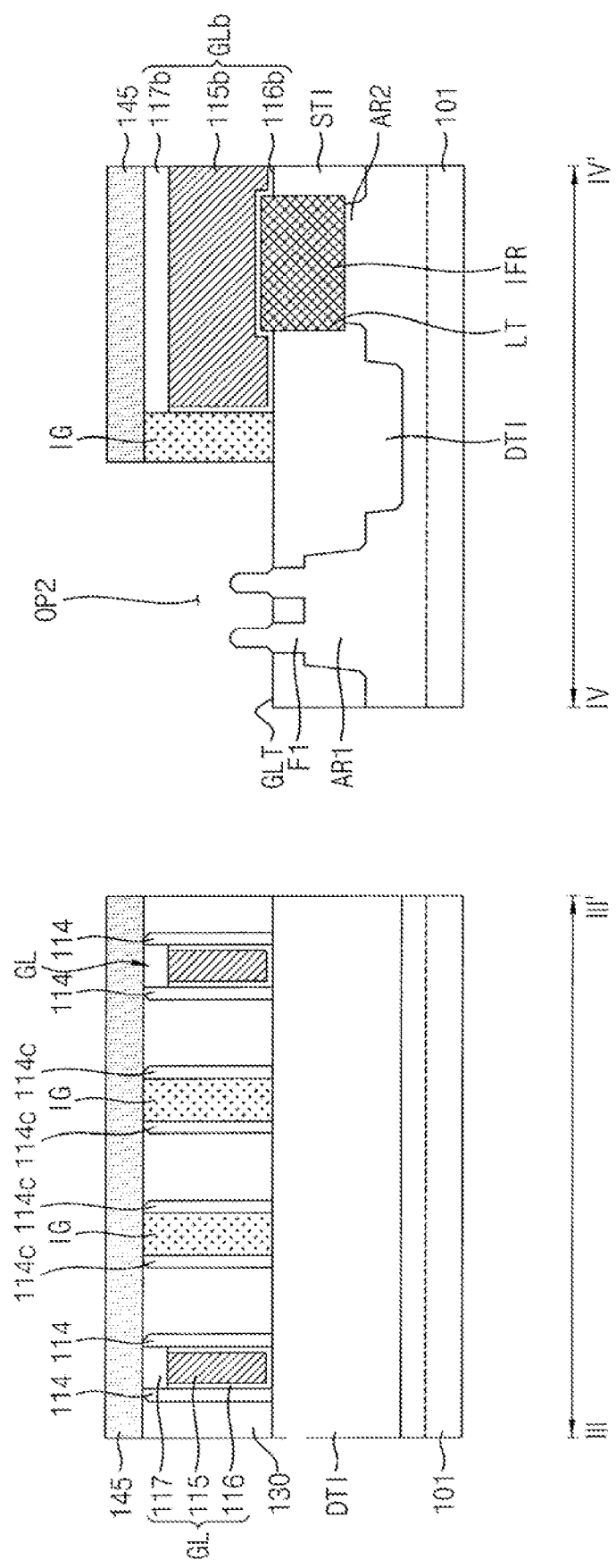

Referring to FIGS. 9A to 9C, an etching process may be performed using a mask layer 145, the first gate spacer 114a, and the first interlayer insulating layer 130 as etch masks to remove the first gate line GLa. The mask layer 145 may cover the first region P and the second region N, and may have an open region OP2 in the first region P. A portion of the top surface of the first interlayer insulating layer 130 and top surfaces of the first gate line GLa and the first gate spacer 114a may be exposed by the open region OP2.

The first gate electrode 115a, the first gate insulating layer 116a, and the first gate capping layer 117a of the first gate line GLa may be removed to form a gate line trench GLT in the first region P. An upper portion of the first active fin F1, portions of the top surfaces of the device isolation layers STI and DTI, and a first side surface of the gate isolation layer IG may be exposed by the gate line trench GLT.

Figure 10A:
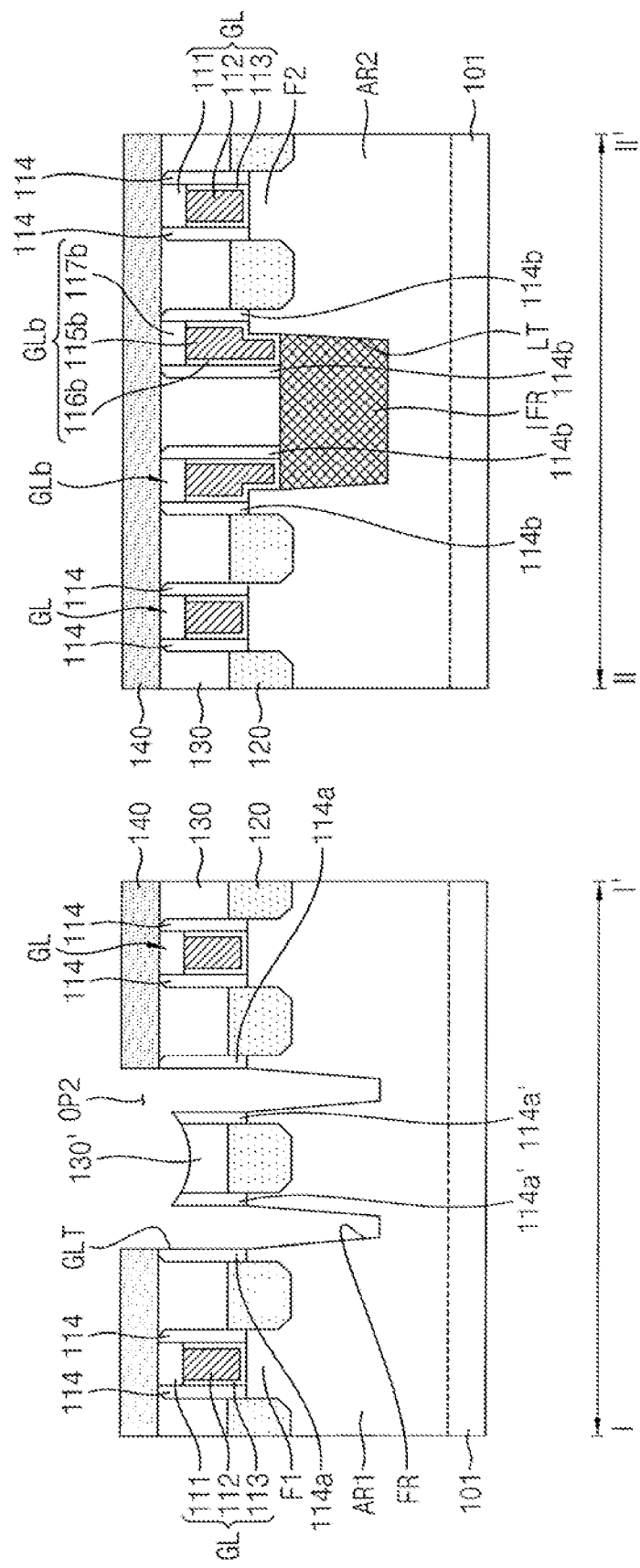
Figure 10B:
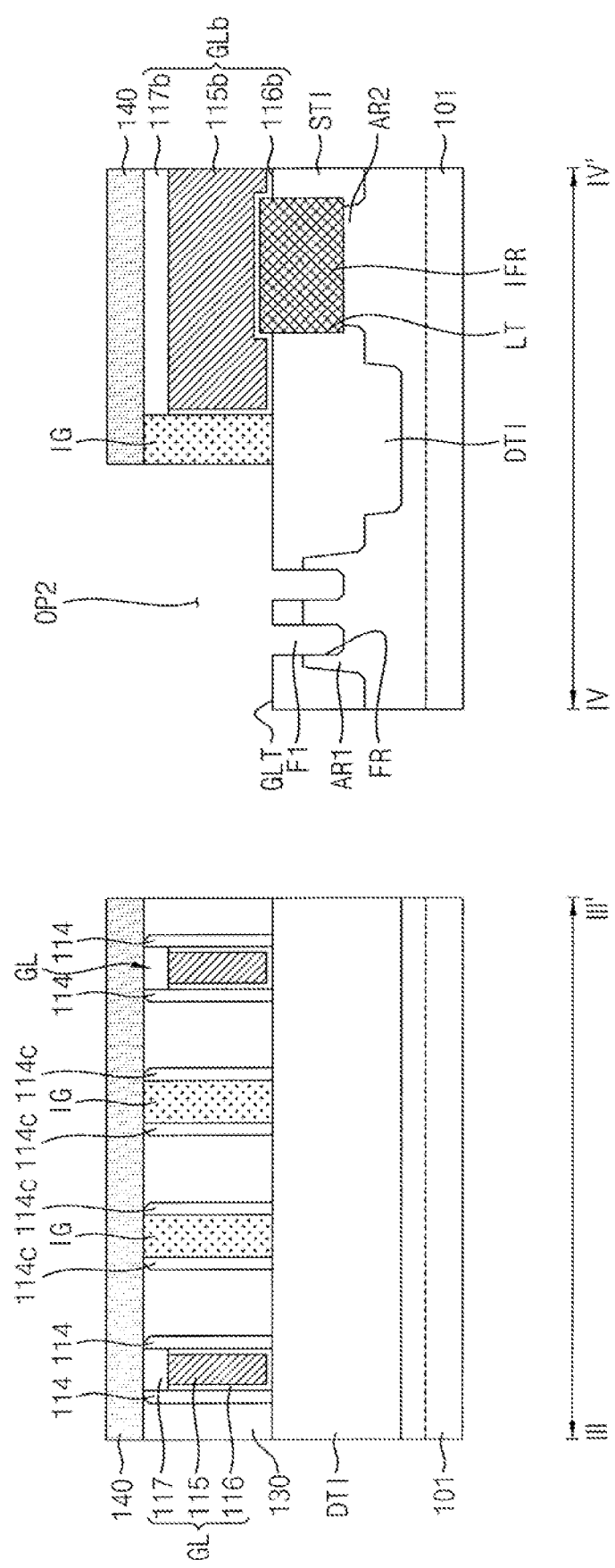

Referring to FIGS. 10A and 10B, upper portions of the first active fins F1 exposed by the gate line trench GLT may be etched in the first region P to form fin recesses FR. That is, the fin recesses FR may be formed by extending portions of the gate line trench GLT downward. The fin recesses FR may be connected to the gate line trench GLT to integrally form a space. The device isolation layers STI and DTI in the first region P may be partially etched during the formation of the fin recesses FR so that the portions of the top surfaces of the device isolation layers STI and DTI exposed by the gate line trench GLT may be at a lower level than unexposed portions of the top surfaces of the device isolation layers STI and DTI. In an embodiment, during the formation of the fin recesses FR, the first interlayer insulating layer 130, of which the top surface is exposed by the open region OP2, and a gate spacer 114a' may be partially etched by the open region OP2. Thereafter, as shown in FIG. 2C, the first field insulating layer DB may fill the fin recesses FR and the gate line trench GLT.

Referring back to FIGS. 10A and 10B, a first interlayer insulating layer 130', the gate spacer 114a', source and drain regions 120, and the first active fin F1 may be etched through the open region OP2, thereby forming fin recesses having a large width and a gate line trench having a large width. Thereafter, as shown in FIGS. 3B to 3D, the first field insulating layer DB may be formed to fill the fin recesses having the large width and the gate line trench having the large width.

According to the example embodiments, a semiconductor device having different diffusion break regions, e.g., different structures and/or different types, in a PMOS region and an NMOS region can be provided to improve performance of each of the PMOS region and the NMOS region. Further, in a process of manufacturing the semiconductor device having different diffusion break regions in the PMOS region and the NMOS region, a gate line of the NMOS region can be prevented from being lost using a gate isolation layer so that the cause of deterioration of characteristics of a transistor can be fundamentally eliminated.

The example embodiments are directed to providing a semiconductor device, of which performance is improved by providing an optimized diffusion break region to each of a P-type metal-oxide-semiconductor (PMOS) region and an N-type MOS (NMOS) region.

In addition, the example embodiments are directed to providing a method of manufacturing a semiconductor device in which an optimized diffusion break region is provided to each of a PMOS region and an NMOS region so that problems caused in the vicinity of a gate line and a diffusion break region can be solved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A semiconductor device, comprising:
   a substrate having a first region and a second region;
   first active fins that extend in a first direction in the first region;
   second active fins that extend in the first direction in the second region;
   a first field insulating layer between the first active fins and that extends in a second direction;
   a second field insulating layer between the second active fins and extends in the second direction;
   a gate line that extends in the second direction on the second field insulating layer, the gate line overlapping the first field insulating layer along the second direction;
   a gate isolation layer between the first field insulating layer and the gate line; and gate spacers that extend in the second direction, the gate spacers in contact with both sidewalls of each of the first field insulating layer, the gate line, and the gate isolation layer.

2. The semiconductor device as claimed in claim 1, wherein the gate line includes:
a gate electrode including a metal, and
a gate insulating layer that extends in the second direction between the gate electrode and the second field insulating layer, and extends in a third direction between the gate electrode and the gate isolation layer.

3. The semiconductor device as claimed in claim 2, wherein a first side surface of the gate isolation layer is in contact with a portion of the gate insulating layer between the gate electrode and the gate isolation layer.

4. The semiconductor device as claimed in claim 3, wherein a second side surface of the gate isolation layer is in contact with a short-axial sidewall of the first field insulating layer.

5. The semiconductor device as claimed in claim 1, wherein the gate isolation layer is in contact with the second field insulating layer.

6. The semiconductor device as claimed in claim 1, wherein two first field insulating layers are adjacent to each other to be parallel to each other on the second filed insulating layer, and a source or drain region is between the two first field insulating layers.

7. The semiconductor device as claimed in claim 1, wherein the first field insulating layer includes a different material from the second field insulating layer.

8. The semiconductor device as claimed in claim 7, wherein the first field insulating layer includes silicon nitride, and the second field insulating layer includes oxide.

9. The semiconductor device as claimed in claim 1, wherein the gate spacer includes outer gate spacers in contact with each outer sidewalls of the first field insulating layer, the gate isolation layer, and the gate line.

10. The semiconductor device as claimed in claim 1, wherein the gate spacer includes inner gate spacers in contact with each inner sidewalls of the first field insulating layer, the gate isolation layer, and the gate line.

11. The semiconductor device as claimed in claim 1, wherein the inner gate spacers are in contact with an upper surface of the second field insulating layer.

12. A semiconductor device, comprising:
a substrate having a first region and a second region;
first active fins that extend in a first direction in the first region;
second active fins that extend in the first direction in the second region;
a first field insulating layer between the first active fins and that extends in a second direction;
a second field insulating layer between the second active fins and extends in the second direction;
a gate line that extends in the second direction on the second field insulating layer, the gate line overlapping the first field insulating layer along the second direction;
a gate isolation layer between the first field insulating layer and the gate line; and
gate spacers that extend in the second direction, the gate spacers in contact with both sidewalls of each of the first field insulating layer, the gate line, and the gate isolation layer,
wherein the gate spacer includes outer gate spacers in contact with each outer sidewalls of the first field insulating layer, the gate isolation layer, and the gate line, and the gate spacer includes inner gate spacers in contact with each inner sidewalls of the first field insulating layer, the gate isolation layer, and the gate line,
wherein one surface of the gate isolation layer is in contact with the first diffusion break region, and the other surface of the gate isolation layer is in contact with the gate line.

* * * * *